(12) United States Patent
Kwon et al.

(10) Patent No.: US 10,461,195 B2
(45) Date of Patent: Oct. 29, 2019

(54) SEMICONDUCTOR DEVICES

(71) Applicant: Samsung Electronics Co., Ltd., Suwon-si (KR)

(72) Inventors: Taesoon Duyeon Kwon, Suwon-si (KR); JeongYun Lee, Yongin-si (KR); A-reum Ji, Hwaseong-si (KR); Kyungseok Min, Yongin-si (KR); GeumJung Seong, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/864,330

(22) Filed: Jan. 8, 2018

(65) Prior Publication Data

US 2018/0301564 A1 Oct. 18, 2018

(30) Foreign Application Priority Data

Apr. 12, 2017 (KR) .................. 10-2017-0047542

(51) Int. Cl.
*H01L 29/786* (2006.01)
*H01L 29/06* (2006.01)
*H01L 29/423* (2006.01)
*H01L 29/78* (2006.01)
*H01L 21/02* (2006.01)
*H01L 21/764* (2006.01)
(Continued)

(52) U.S. Cl.
CPC ........ *H01L 29/78618* (2013.01); *B82Y 10/00* (2013.01); *H01L 21/02603* (2013.01); *H01L 21/764* (2013.01); *H01L 29/0653* (2013.01); *H01L 29/0673* (2013.01); *H01L 29/41725* (2013.01); *H01L 29/42392* (2013.01); *H01L 29/66545* (2013.01); *H01L 29/66742* (2013.01); *H01L 29/775* (2013.01); *H01L 29/7845* (2013.01); *H01L 29/78696* (2013.01); *H01L 29/165* (2013.01); *H01L 29/7848* (2013.01)

(58) Field of Classification Search
CPC ............ H01L 21/7682; H01L 29/0649; H01L 29/0653; H01L 29/42392; H01L 29/4991; H01L 29/78618
See application file for complete search history.

(56) References Cited

U.S. PATENT DOCUMENTS 7,229,884 B2 6/2007 Park
7,534,687 B2 5/2009 Hara
(Continued)

FOREIGN PATENT DOCUMENTS

JP 3324518 B2 9/2002
KR 10-0546286 B1 1/2006

*Primary Examiner* — Matthew L Reames
*Assistant Examiner* — John A Bodnar
(74) *Attorney, Agent, or Firm* — Muir Patent Law, PLLC

(57) ABSTRACT

Disclosed is a semiconductor device. The semiconductor device includes a substrate, channel semiconductor patterns vertically stacked and spaced apart from each other on the substrate, a gate electrode running across the channel semiconductor patterns, source/drain regions at opposite sides of the gate electrode, the source/drain regions being connected to the channel semiconductor patterns, and air gaps between the substrate and bottom surfaces of the source/drain regions so that the bottom surfaces of the source/drain regions do not contact the substrate.

18 Claims, 35 Drawing Sheets

(51) Int. Cl.
  *H01L 29/66* (2006.01)
  *B82Y 10/00* (2011.01)
  *H01L 29/417* (2006.01)
  *H01L 29/775* (2006.01)
  *H01L 29/165* (2006.01)

(56) References Cited

U.S. PATENT DOCUMENTS

| | | |
|---|---|---|
| 7,984,408 B2 | 7/2011 | Cheng et al. |
| 8,110,471 B2 | 2/2012 | Lee et al. |
| 8,395,217 B1 | 3/2013 | Cheng et al. |
| 8,987,794 B2 | 3/2015 | Rachmady et al. |
| 9,059,203 B2 | 6/2015 | Furukawa et al. |
| 9,343,374 B1 | 5/2016 | Hoentschel et al. |
| 9,362,355 B1 * | 6/2016 | Cheng ............... H01L 29/66742 |
| 9,437,502 B1 * | 9/2016 | Cheng ............. H01L 21/823842 |
| 9,576,967 B1 * | 2/2017 | Kimura ............ H01L 27/11565 |
| 9,601,379 B1 * | 3/2017 | Pawlak ............ H01L 29/42392 |
| 9,837,414 B1 * | 12/2017 | Balakrishnan ...... H01L 29/1083 |
| 2009/0289305 A1 | 11/2009 | Majumdar et al. |
| 2015/0295036 A1 | 10/2015 | Hong |
| 2016/0133728 A1 | 5/2016 | Jang et al. |
| 2016/0190239 A1 | 6/2016 | Suk et al. |
| 2017/0170294 A1 * | 6/2017 | Doris .................... H01L 29/267 |
| 2017/0256456 A1 * | 9/2017 | Lee .................... H01L 21/3081 |
| 2017/0309719 A1 * | 10/2017 | Sun .................. H01L 29/42392 |

* cited by examiner

SEMICONDUCTOR DEVICES

CROSS-REFERENCE TO RELATED APPLICATIONS

This U.S. nonprovisional patent application claims priority under 35 U.S.C. § 119 to Korean Patent Application No. 10-2017-0047542 filed on Apr. 12, 2017 entire contents of which are hereby incorporated by reference.

BACKGROUND

The present disclosure relates to a semiconductor device, and more particularly, to a semiconductor device including a field effect transistor.

A semiconductor device may be an important factor in electronic industry because of its small size, multi-function, and/or low fabrication cost. The semiconductor device may be categorized as any one of a semiconductor memory device storing logic data, a semiconductor logic device processing operations of logic data, and a hybrid semiconductor device having both memory and logic elements. The semiconductor device has been increasingly required for high integration with the advanced development of the electronic industry. For example, demands for a semiconductor device having high reliability, high speed, and/or multifunction characteristics have been increasing recently. To meet these demands, the semiconductor device has been becoming gradually complicated and highly integrated.

SUMMARY

Embodiments of the present disclosure provide a semiconductor device including a field effect transistor that has enhanced electrical characteristics.

According to exemplary embodiments of the present disclosure, a semiconductor device may comprise: a substrate; channel semiconductor patterns vertically stacked and spaced apart from each other on the substrate; a gate electrode running across the channel semiconductor patterns; source/drain regions at opposite sides of the gate electrode, the source/drain regions being connected to the channel semiconductor patterns; and air gaps between the substrate and bottom surfaces of the source/drain regions so that the bottom surfaces of the source/drain regions do not contact the substrate.

According to exemplary embodiments of the present disclosure, a semiconductor device may comprise: an active pattern protruding from a substrate; a channel stack on the active pattern; a gate electrode covering the channel stack and running across the active pattern; source/drain regions on the active pattern on opposite sides of the gate electrode; and growth prevention regions between the source/drain regions and the active pattern under the source/drain regions. The channel stack may comprise channel semiconductor patterns vertically stacked and spaced apart from each other. Air gaps may be provided between the source/drain regions and the growth prevention regions so that the source/drain regions do not contact the growth prevention regions.

According to exemplary embodiments of the present disclosure, a semiconductor device may comprise: a substrate having an active pattern extending in a first direction, the active pattern having a first region and second regions on opposite sides of the first region; channel semiconductor patterns vertically stacked and spaced apart from each other on the first region of the active pattern; a gate structure extending in a second direction perpendicular to the first direction and running across the channel semiconductor patterns; source/drain regions on the second regions of the active pattern and at opposite sides of the gate structure, the source/drain regions being connected to the channel semiconductor patterns; inner spacers disposed on sidewalls of the gate structure; and an air gap between bottom surfaces of the source/drain regions and top surfaces of the second regions so that the bottom surfaces of the source/drain regions do not contact the top surfaces of the second regions. A top surface of the air gap may be defined by the bottom surfaces of the source/drain regions, a bottom surface of the air gap may be defined by the top surfaces of the second regions and sidewalls of the air gap may be defined by a lowermost inner spacer of the inner spacers.

DETAILED DESCRIPTION OF EMBODIMENTS

The present disclosure will now be described more fully with reference to the accompanying drawings, in which exemplary embodiments of the present disclosure are shown. Embodiments of the present disclosure described below may be implemented as one of them, and also, the embodiments described below may be implemented by combining at least two of the embodiments. Therefore, the scope of the present disclosure should not be construed as being limited to any one embodiment.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Figure 1:
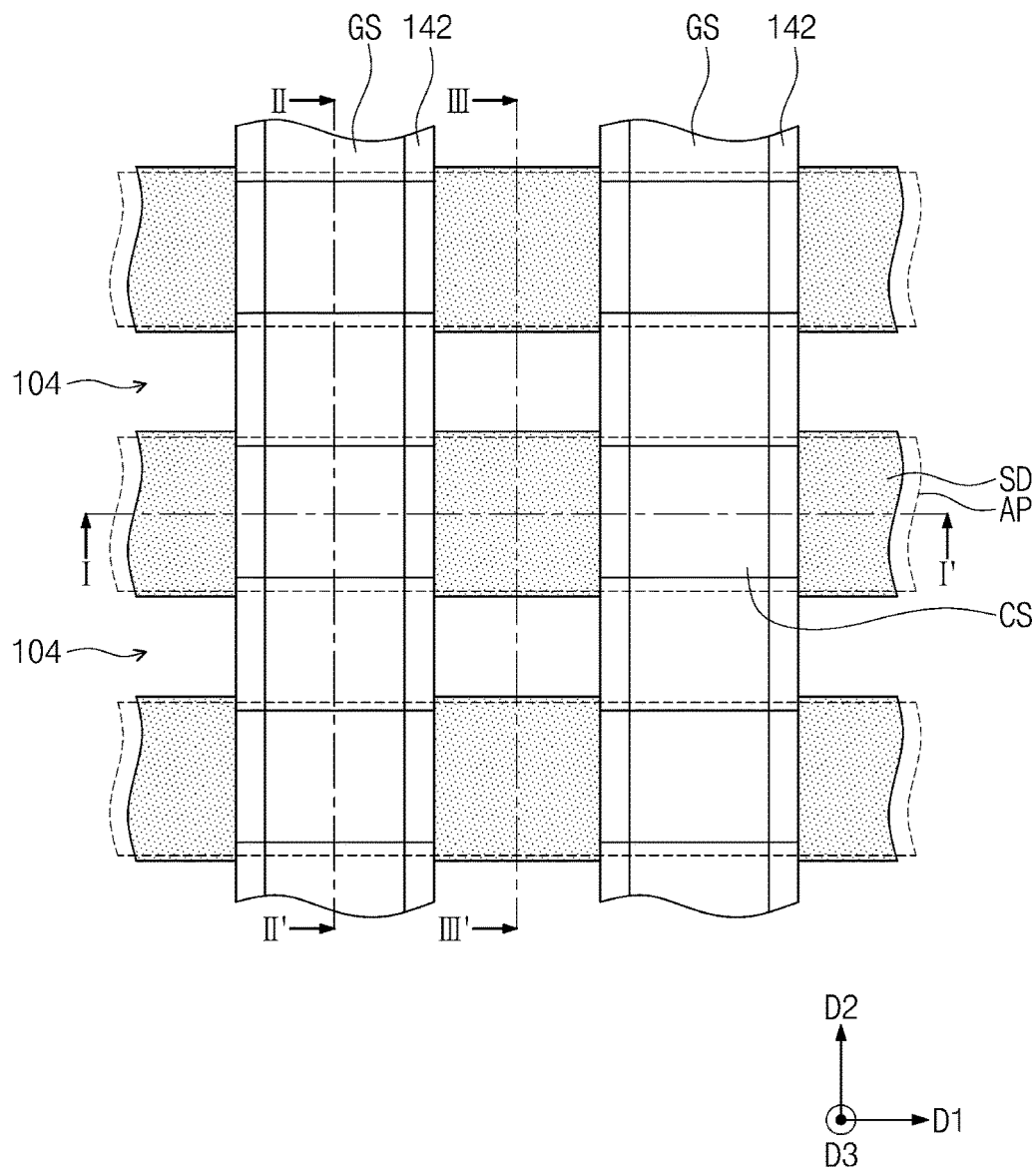
FIG. 1 is a plan view for explaining a semiconductor device according to exemplary embodiments of the present disclosure.
Figure 2A:
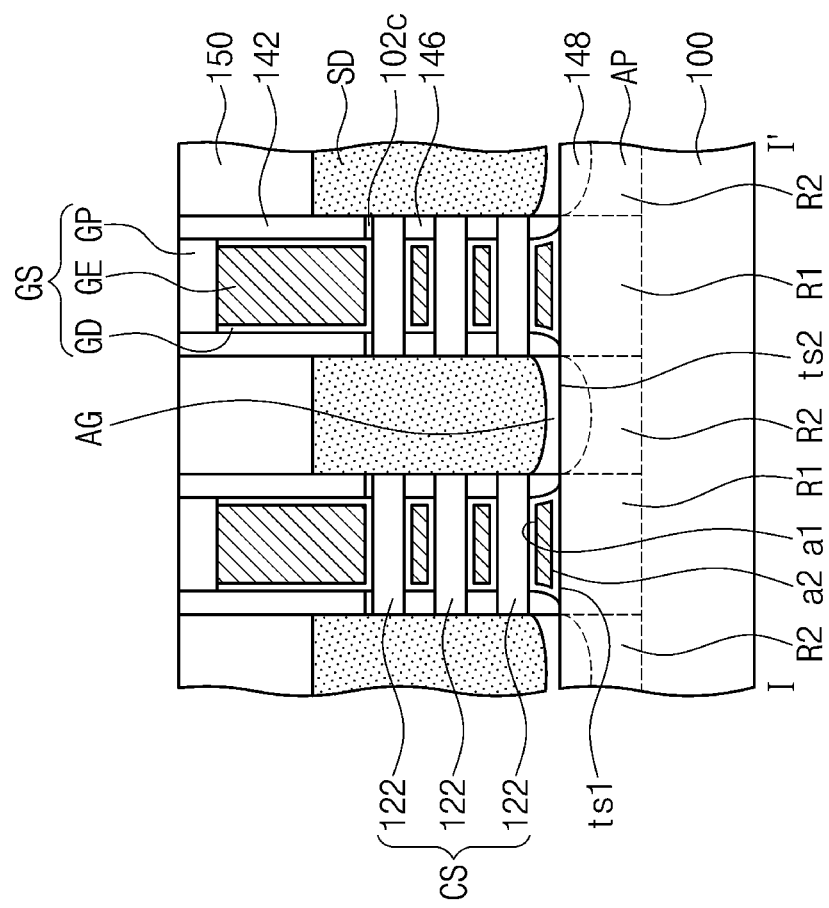
FIG. 2A is a cross-sectional view taken along line I-I' of FIG. 1.
Figure 2B:
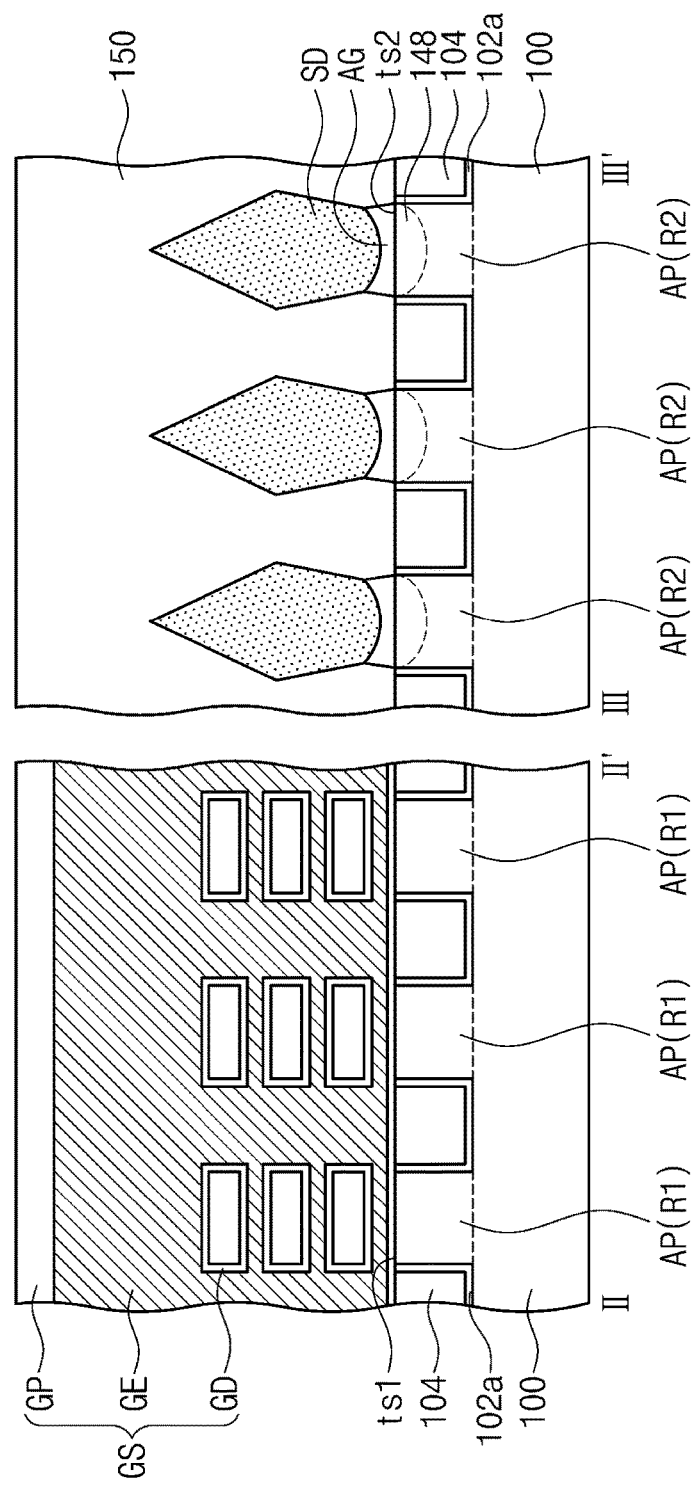
FIG. 2B is a cross-sectional view taken along lines II-II' and III-III' of FIG. 2A.
Figure 3:
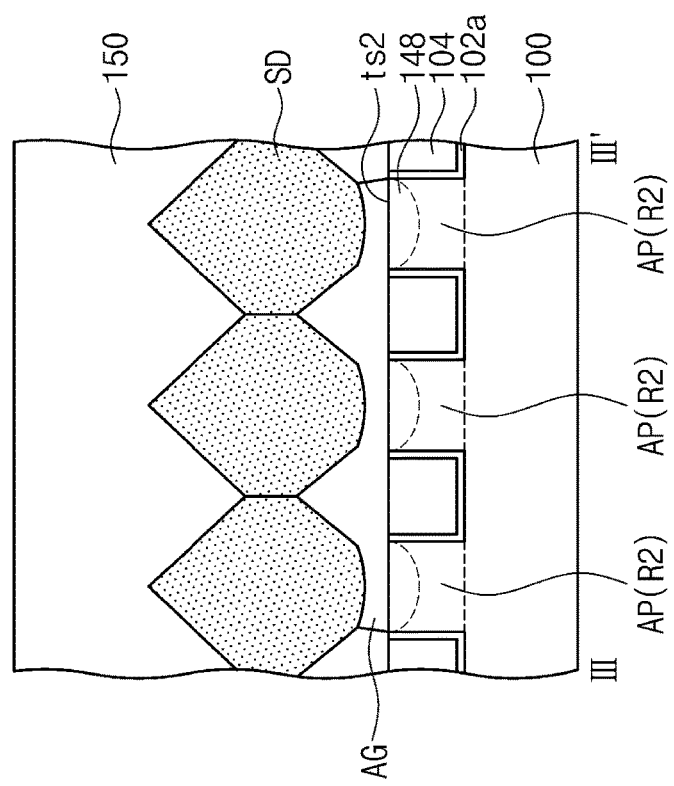
FIG. 3 is a cross-sectional view corresponding to line III-III' of FIG. 1 for explaining an example of source/drain regions.

FIG. 1 is a plan view for explaining a semiconductor device according to exemplary embodiments of the present disclosure. FIG. 2A is a cross-sectional view taken along line I-I' of FIG. 1, and FIG. 2B is a cross-sectional view taken along lines II-II' and III-III' of FIG. 2A. FIG. 3 is a cross-sectional view corresponding to line of FIG. 1 for explaining an example of source/drain regions.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Referring to FIGS. 1, 2A, and 2B, active patterns AP may be disposed on a substrate 100. The active patterns AP may have a bar or linear shape extending in a first direction D1, and be arranged spaced apart from each other in a second direction D2 crossing (e.g., perpendicular to) the first direction D1. The active patterns AP may have a fin shape protruding in a third direction D3 perpendicular to a top surface of the substrate 100. The active patterns AP may be portions of the substrate 100. Each of the active patterns AP may include a first region R1 under a gate structure GS, which will be discussed below, and a second region R2 at a side or opposite sides of the gate structure GS. In some embodiments, the first region R1 may have a top surface ts1 at the same level and coplanar as that of a top surface ts2 of the second region R2 in a direction perpendicular to the top surface of the substrate 100, but the present disclosure is not limited thereto. In other embodiments, the top surface ts2 of the second region R2 may be lower than the top surface ts1 of the first region R1. The substrate 100 may be a semiconductor substrate. For example, the substrate 100 may be a silicon substrate, a germanium substrate, or a silicon-germanium substrate.

Device isolation patterns 104 may be disposed on the substrate 100 at a side or opposite sides of each active pattern AP. The device isolation patterns 104 may include, for example, silicon oxide. The device isolation patterns 104 may have top surfaces at the same level and coplanar as those of the top surfaces ts1 and ts2 of the active patterns AP in a direction perpendicular to the top surface of the substrate 100, but the present disclosure is not limited thereto. In some embodiments, a first liner pattern 102a may be interposed between the device isolation pattern 104 and the substrate 100 and between the device isolation pattern 104 and its adjacent active patterns AP. For example, the first liner pattern 102a may cover opposing sidewalls of neighboring active patterns AP and extend between the substrate 100 and the device isolation pattern 104. The first liner pattern 102a may include a nitride-based material such as silicon nitride or silicon carbonitride.

Channel stacks CS may be provided on the first regions R1 of the active patterns AP. The channel stacks CS may be two-dimensionally arranged along the first and second directions D1 and D2. Each of the channel stacks CS may include a plurality of channel semiconductor patterns 122 that are vertically stacked and spaced apart from each other. The channel semiconductor patterns 122 included in a single channel stack CS may be spaced apart from the substrate 100 (or the active pattern AP) at different distances from each other in the third direction D3. A single channel stack CS is illustrated to include three stacked channel semiconductor patterns 122, but the number of the channel semiconductor patterns 122 is not especially limited thereto. Each of the channel semiconductor patterns 122 may be embodied in a rectangular parallelepiped nano-sheet shape. For example, each of the channel semiconductor patterns 122 may have a thickness of about 3 nm to about 20 nm in a direction perpendicular to a top surface of the substrate 100. The channel semiconductor patterns 122 may have the same thickness, but the present disclosure is not limited thereto. The channel semiconductor patterns 122 may include a semiconductor material that can be used as a channel region of a field effect transistor. For example, the channel semiconductor patterns 122 may include Si, SiGe, or Ge. The channel semiconductor patterns 122 may be doped with n- or p-type impurities.

The substrate 100 may be provided thereon with gate structures GS arranged along the first direction D1. Each of the gate structures GS may cover at least one channel stack CS and extend in the second direction D2. For example, each of the gate structures GS may extend in the second direction D2, while covering a plurality of the channel stacks CS arranged along the second direction D2.

In detail, each of the gate structures GS may include a gate electrode GE, a gate dielectric pattern GD, and a gate capping pattern GP. The gate electrode GE may extend in the second direction D2 and cover a top surface of the channel stack CS (or a top surface of an uppermost channel semiconductor pattern 122). The gate dielectric pattern GD may extend along a sidewall and a bottom surface of the gate electrode GE. The gate capping pattern GP may cover the gate electrode GE and the gate dielectric pattern GD. The gate capping pattern GP may have a bottom surface in contact with top surfaces of the gate dielectric pattern GD and the gate electrode GE. For example, in some embodiments, a lowermost surface of the gate capping pattern GP, an uppermost surface of the gate dielectric pattern GD, and an uppermost surface of the gate electrode GE are coplanar and at the same level in a direction perpendicular to a top surface of the substrate 100. The gate electrode GE and the gate dielectric pattern GD may fill spaces between the channel semiconductor patterns 122 vertically adjacent to each other and between a lowermost channel semiconductor pattern 122 and the substrate 100 (i.e., the first region R1 of the active pattern AP). For example, the gate electrode GE and the gate dielectric pattern GD may surround an outer surface of each of the channel semiconductor patterns 122. For example, each of the channel semiconductor patterns 122 may penetrate the gate structure GS and have opposite ends protruding from opposite sidewalls of the gate structure GS. For example, the channel stack CS and the gate structure GS may define a transistor, which is a gate-all-around type field effect transistor including a channel region whose outer surface is surrounded by the gate electrode GE.

The gate electrode GE may include doped semiconductor, conductive metal nitride, and/or metal. For example, the gate electrode GE may include metal nitride such as TiN, WN, and TaN, and/or metal such as Ti, W, and Ta. The gate dielectric pattern GD may include one or more of a silicon oxide layer, a silicon nitride layer, a silicon oxynitride layer, and a high-k dielectric layer. The high-k dielectric layer may include a material, such as hafnium oxide (HfO), aluminum oxide (AlO), or tantalum oxide (TaO), whose dielectric constant is greater than that of a silicon oxide layer. The gate capping pattern GP may include one or more of a silicon oxide layer, a silicon nitride layer, and a silicon oxynitride layer.

In some embodiments, the gate electrode GE may have an upper sidewall substantially perpendicular to the top surface of the substrate 100 and a lower sidewall having a concave slope. For example, as shown in FIG. 2A, the gate electrode GE above the lowermost channel semiconductor pattern 122 may have a substantially uniform width, while the gate electrode GE under the lowermost channel semiconductor pattern 122 may have a width that increases as approaching the substrate 100. For example, as illustrated in FIG. 2A, the uppermost surface a1 of the gate electrode GE under the lowermost channel semiconductor pattern 122 has a smaller length extending along a direction parallel to a top surface of the substrate 100 than the lowermost surface a2 of the gate electrode GE under the lowermost channel semiconductor pattern 122 extending along the direction parallel to the top surface of the substrate 100.

Source/drain regions SD may be disposed on the active patterns AP at opposite sides of the gate structure GS. For example, the source/drain regions SD may be disposed on the second regions R2 of the active patterns AP. A pair of neighboring source/drain regions SD may be connected to the channel stack CS interposed therebetween. For example, the channel semiconductor patterns 122 included in a single channel stack CS may connect a pair of neighboring source/drain regions SD to each other. The source/drain regions SD may be epitaxial patterns grown from the channel semiconductor patterns 122 serving as seed layers.

The source/drain regions SD may provide strain to the channel semiconductor patterns 122. When the source/drain regions SD constitute an NMOSFET, the source/drain regions SD may include a semiconductor material that provides the channel semiconductor pattern 122 with a tensile strain. For example, when the channel semiconductor patterns 122 include Si, the source/drain regions SD may each include a SiC layer whose lattice constant is less than that of Si or a Si layer whose lattice constant is substantially the same as that of the channel semiconductor pattern 122. In this exemplary embodiment, the source/drain regions SD may have, for example, an N-type conductivity. When the source/drain regions SD constitute a PMOSFET, the source/drain regions SD may include a material that provides the channel semiconductor pattern 122 with a compressive strain. For example, when the channel semiconductor patterns 122 include Si, the source/drain regions SD may each include a SiGe layer whose lattice constant is greater than that of Si. In this exemplary embodiment, the source/drain regions SD may have, for example, a P-type conductivity.

As viewed in cross-section taken along the second direction D2, the source/drain regions SD may have sidewalls having a laterally sharp wedge shape. For example, the source/drain regions SD may have their sidewalls each of which includes a lower sidewall substantially negatively inclined to the top surface of the substrate 100 and an upper sidewall substantially positively inclined to the top surface of the substrate 100. The source/drain regions SD may have bottom surfaces convexly curved toward the substrate 100. In some embodiments, a space may be provided between opposing sidewalls of neighboring source/drain regions SD. Embodiments of the present disclosure, however, are not limited thereto. In other embodiments, as shown in FIG. 3, a connection may be made between opposing sidewalls of neighboring source/drain regions SD. In this exemplary embodiment, the connected opposing sidewalls of neighboring source/drain regions SD may be provided therebelow with empty spaces, or air gaps AG, spatially connected to each other. The term "air" as discussed herein, may refer to atmospheric air, or other gases that may be present during the manufacturing process.

According to the present disclosure, growth prevention regions 148 may be provided under the bottom surfaces of the source/drain regions SD. In some embodiments, the growth prevention regions 148 may be impurity regions formed in the active patterns AP under the bottom surfaces of the source/drain regions SD. The growth prevention regions 148 may be portions of the substrate 100 that include one or more of carbon (C), oxygen (O), arsenic (As), and nitrogen (N). The growth prevention regions 148 may prevent growth of epitaxial layers from the active patterns AP serving as seed layers when an epitaxial growth process is performed to form the source/drain regions SD. In consequence, the source/drain regions SD may be spaced apart from their underlying active patterns AP. No contact may thus be made between the bottom surfaces of the source/drain regions SD and the top surfaces ts2 of the second regions R2. For example, the bottom surfaces of the source/drain regions SD may be lower than a bottom surface of the lowermost channel semiconductor pattern 122 and higher than the top surfaces ts2 of the second regions R2. In addition, the air gaps AG may be provided between the bottom surfaces of the source/drain regions SD and the top surfaces ts2 of the second regions R2 so that the bottom surfaces of the source/drain regions SD do not contact the top surfaces ts2 of the second regions R2. Thus, due to the presence of these air gaps AG, the bottom surfaces of the source/drain regions SD do not contact the substrate 100 thereby preventing or minimizing a current leakage between the source/drain regions SD and the substrate 100. The air gap AG may be a substantially empty space where no solid material is provided. For example, the air gap AG may have a top surface defined by the bottom surface of the source/drain region SD, a bottom surface defined by the top surface ts2 of the second region R2, and sidewalls defined by a lowermost internal spacer 146 and a lower interlayer dielectric layer 150 which are discussed below.

A gate spacer 142 may be disposed on either sidewall of the gate electrode GE. The gate spacer 142 may extend in the second direction D2 along the sidewall of the gate electrode GE. The gate spacer 142 may be a single layer or a multiple layer. For example, the gate spacer 142 may include one or more of a silicon nitride layer, a silicon oxynitride layer, and a silicon carbonitride layer. A second liner pattern 102c may be disposed between the gate spacer 142 and the uppermost channel semiconductor pattern 122. The second liner pattern 102c may extend in the second direction D2 along a bottom surface of the gate spacer 142. The second liner pattern 102c may include the same material as that of the first liner pattern 102a.

On an area where the channel stack CS overlaps the gate structure GS, inner spaces 146 may be disposed on the sidewalls of the gate structure GS that are under the gate spacers 142. As vertically viewed, the inner spacers 146 may be locally disposed between the channel semiconductor patterns 122 adjacent to each other and between the lowermost channel semiconductor pattern 122 and the active pattern AP. As horizontally viewed, the inner spacers 146 positioned at a higher level than that of the lowermost channel semiconductor pattern 122 may be locally disposed between the source/drain regions SD and the opposite sidewalls of the gate structure GS, and a lowermost inner spacer 146 may define the sidewall of the air gap AG. The inner spacers 146 may be in contact with the gate dielectric patterns GD. Each of the inner spacers 146 may include one or more of a silicon nitride layer, a silicon oxynitride layer, and a silicon carbonitride layer. In some embodiments, the inner spacer 146 may include the same material as that of the gate spacer 142.

The substrate 100 may be provided thereon with a lower interlayer dielectric layer 150 covering the source/drain regions SD and the sidewalls of the gate structures GS. The lower interlayer dielectric layer 150 may expose a top surface of the gate structure GS. For example, the lower interlayer dielectric layer 150 may have a top surface whose height is substantially the same as those of top surface of the gate capping patterns GP. The lower interlayer dielectric layer 150 may include one or more of a silicon oxide layer and a low-k dielectric layer whose dielectric constant is less than that of a silicon oxide layer. An upper interlayer dielectric layer (not shown) may be disposed on the lower interlayer dielectric layer 150. Contact plugs (not shown) may penetrate the upper interlayer dielectric layer, the lower interlayer dielectric layer 150, and/or the gate capping pattern GP, and be coupled to the gate electrodes GE or the source/drain regions SD. The upper interlayer dielectric layer may be provided thereon with wiring lines (not shown) connected to the contact plugs.

According to exemplary embodiments of the present disclosure, since the source/drain regions SD are spaced apart from their underlying substrate 100 (i.e., the active patterns AP), a current leakage may be prevented or minimized between the source/drain regions SD and the substrate 100. In addition, since the source/drain regions SD are embodied as epitaxial patterns grown only from the channel semiconductor patterns 122 serving as seed layers, an increased strain may be provided to the channel semiconductor patterns 122 in comparison with conventional source/drain regions SD that are embodied as epitaxial patterns grown both from the substrate 100 and the channel semiconductor patterns 122 serving as seed layers. As a result, a semiconductor device according to the present disclosure may have enhanced electrical characteristics.

FIGS. 4A, 5A, 6A, 7A, 8A, 9A, 10A, and 11A are cross-sectional views corresponding to line I-I' of FIG. 1 for explaining a method of fabricating a semiconductor device according to exemplary embodiments of the present disclosure. FIGS. 4B, 5B, 6B, 7B, 8B, 9B, 10B, and 11B are cross-sectional views each corresponding to lines II-II' and III-III' of FIG. 1. For brevity of the description, a repetitive description will be omitted.

Figure 4A:
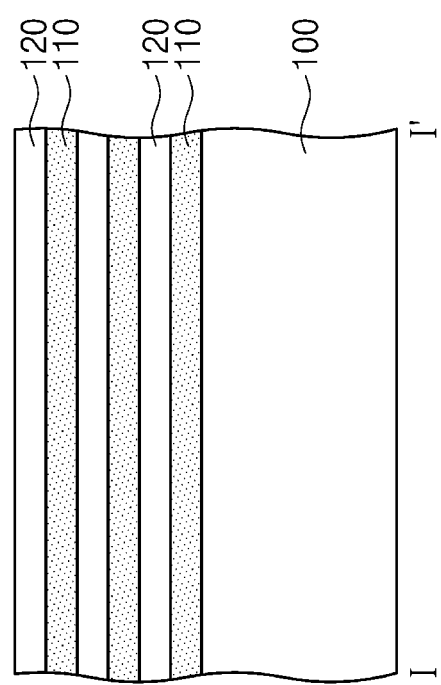
FIGS. 4A, 5A, 6A, 7A, 8A, 9A, 10A and 11A are cross-sectional views corresponding to line I-I' of FIG. 1 for explaining a method of fabricating a semiconductor device according to exemplary embodiments of the present disclosure.
Figure 4B:
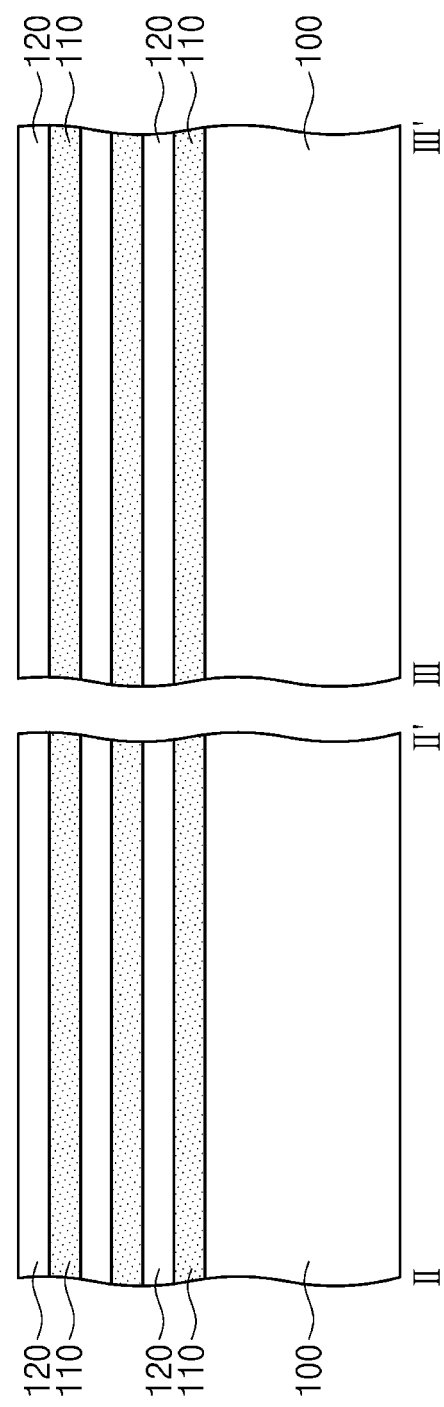
FIGS. 4B, 5B, 6B, 7B, 8B, 9B, 10B, and 11B are cross-sectional views each corresponding to lines II-II' and III-III' of FIG. 1.

Referring to FIGS. 1, 4A, and 4B, sacrificial semiconductor layers 110 and channel semiconductor layers 120 may be alternately and repeatedly stacked on a substrate 100. The sacrificial semiconductor layers 110 and the channel semiconductor layers 120 are each illustrated repeatedly stacked three times, but the present disclosure is not limited thereto. For example, the sacrificial semiconductor layers 110 may include a material having an etch selectivity to the channel semiconductor layers 120. For example, the sacrificial semiconductor layers 110 may be formed of a material capable of being etched while minimizing etching of the channel semiconductor layers 110 when the sacrificial semiconductor layers 120 are etched by an etching process using a predetermined etch recipe. This etch selectivity may be quantitatively expressed as a ratio of an etch rate of the sacrificial semiconductor layers 110 to an etch rate of the channel semiconductor layers 120. In some embodiments, the sacrificial semiconductor layers 110 may include one of materials exhibiting an etch selectivity of about 1:10 to about 1:200 with respect to the channel semiconductor layers 120. For example, the sacrificial semiconductor layers 110 may be one of SiGe, Si and Ge, and the channel semiconductor layers 120 may be another of SiGe, Si and Ge that is not the material composition of the sacrificial semiconductor layers 110.

The sacrificial semiconductor layers 110 and the channel semiconductor layers 120 may be formed by an epitaxial growth process in which the substrate 100 is used as a seed layer. For example, the epitaxial growth process may be a chemical vapor deposition (CVD) process or a molecular beam epitaxy (MBE) process. The sacrificial semiconductor layers 110 and the channel semiconductor layers 120 may be successively formed in the same chamber. The sacrificial semiconductor layers 110 and the channel semiconductor layers 120 may be conformally grown on an entire surface of the substrate 100 without being selectively grown on the substrate 100. The sacrificial semiconductor layers 110 and the channel semiconductor layers 120 may be formed to have substantially the same thickness, but the present disclosure is not limited thereto.

Figure 5A:
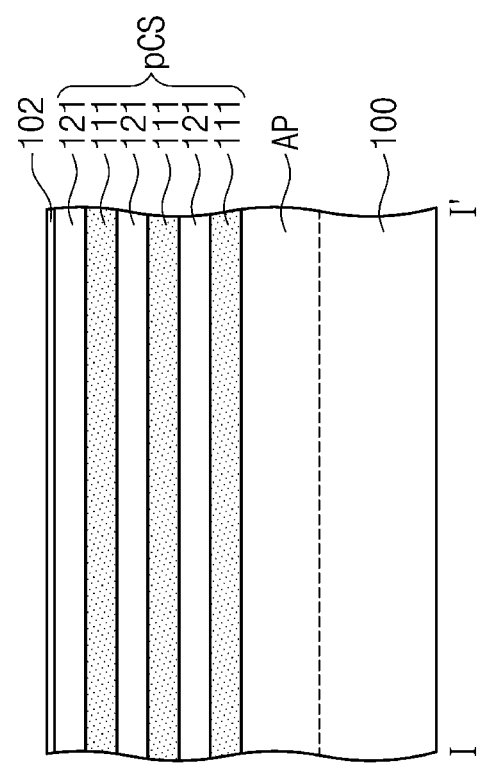
Figure 5B:
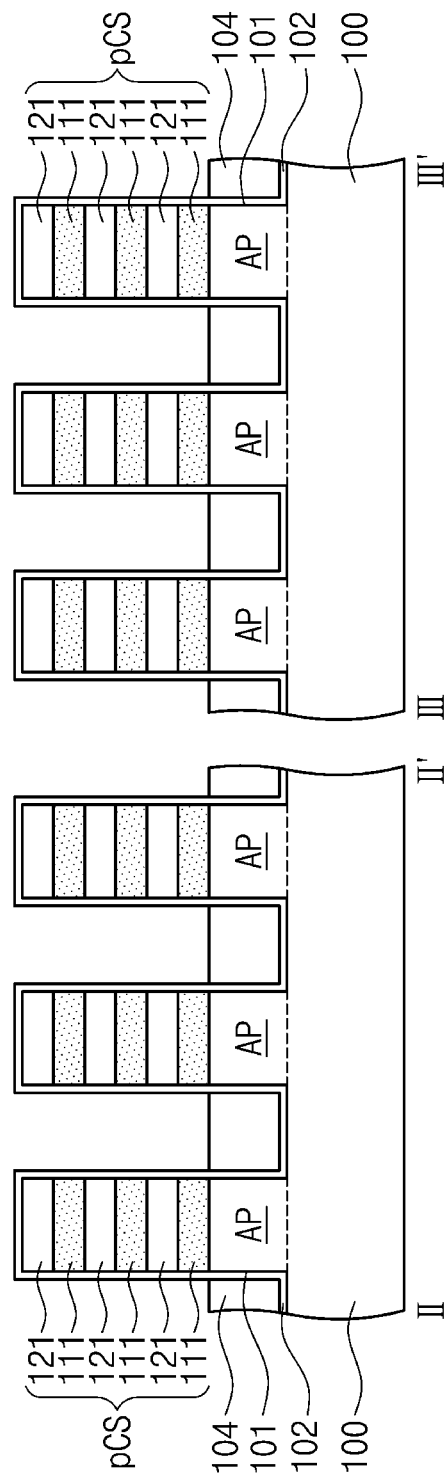

Referring to FIGS. 1, 5A, and 5B, the sacrificial semiconductor layers 110 and the channel semiconductor layers 120 may be patterned to form preliminary channel stacks pCS. The preliminary channel stacks pCS may have linear or bar shapes extending in a first direction D1 and be spaced apart from each other in a second direction D2. Each of the preliminary channel stacks pCS may include preliminary sacrificial semiconductor patterns 111 formed from the sacrificial semiconductor layers 110 and preliminary channel semiconductor patterns 121 formed from the channel semiconductor layers 120. In some embodiments, the patterning of the sacrificial semiconductor layers 110 and the channel semiconductor layers 120 may employ an anisotropic etching process using a mask pattern (not shown). When the anisotropic etching process is performed, an upper portion of the substrate 100 may also be etched to form trenches 101 defining active patterns AP. The active patterns AP may be formed under the preliminary channel stacks pCS and extend in the first direction D1.

A liner layer 102 may be formed on the substrate 100. The liner layer 102 may conformally cover inner surfaces of the trenches 101 and top surfaces and sidewalls of the preliminary channel stacks pCS. The liner layer 102 may be formed of a nitride-based material. For example, the liner layer 102 may include silicon nitride or silicon carbonitride. The liner layer 102 may be formed by atomic layer deposition (ALD), low pressure chemical vapor deposition (LPCVD), plasma enhanced chemical vapor deposition (PECVD), or plasma nitridation. The liner layer 102 may prevent damages of the active patterns AP and the preliminary channel stacks pCS in a subsequent process. Device isolation patterns 104 may be formed on the substrate 100. The device isolation patterns 104 may be formed by forming a device isolation layer to fill the trenches 101 and cover the preliminary channel stacks pCS and then planarizing and/or etching the device isolation layer to expose the preliminary channel sacks pCS. The device isolation layer may include silicon oxide.

Figure 6A:
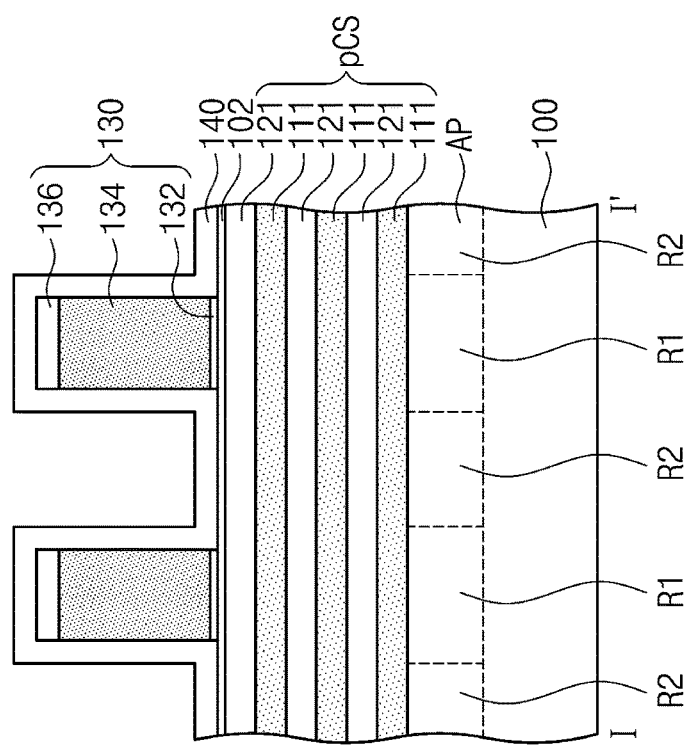
Figure 6B:
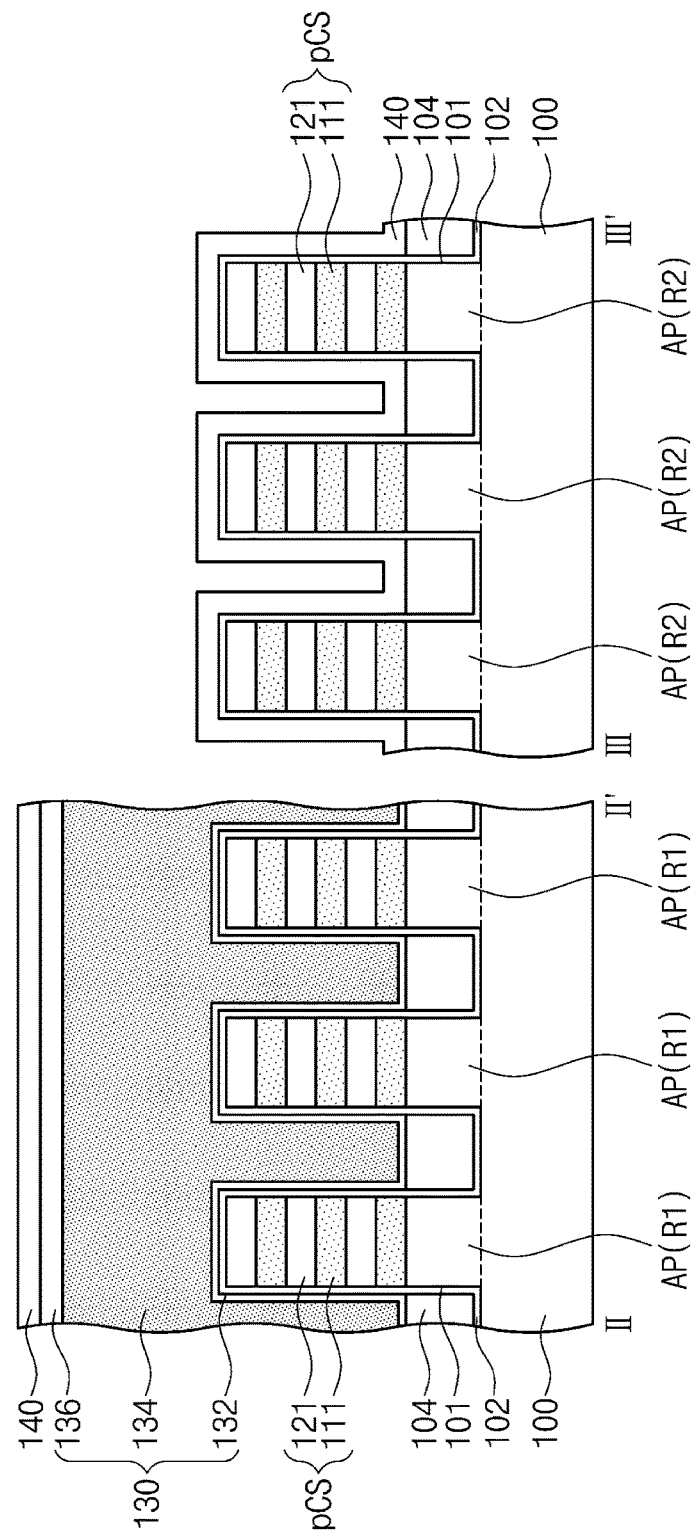

Referring to FIGS. 1, 6A, and 6B, sacrificial gate structures 130 may be formed on the substrate 100 to cover the preliminary channel stacks pCS and run across the active patterns AP. The sacrificial gate structures 130 may be disposed along the first direction D1, and extend in the second direction D2, while covering the top surfaces and the sidewalls of the preliminary channel stacks pCS. Each of the sacrificial gate structures 130 may include an etch stop pattern 132, a sacrificial gate pattern 134, and a gate mask pattern 136 that are sequentially stacked.

In some embodiments, the sacrificial gate structures 130 may be formed by sequentially forming an etch stop layer, a sacrificial gate layer, and a gate mask layer to cover the preliminary channel stacks pCS and then patterning the etch stop layer, the sacrificial gate layer, and the gate mask layer. The etch stop layer may include, for example, silicon oxide. The sacrificial gate layer may include a material having an etch selectivity to the etch stop layer. For example, the sacrificial gate layer may include polysilicon. The gate mask layer may include silicon nitride or silicon oxynitride. The etch stop layer, the sacrificial gate layer, and the gate mask layer may be formed by chemical vapor deposition (CVD), physical vapor deposition (PVD), or atomic layer deposition (ALD). The sacrificial gate structure 130 may be formed to run across the active pattern AP, thereby defining a first regions R1 and second regions R2 in the active pattern AP. The first region R1 may be a portion of the active pattern AP that is positioned under the sacrificial structure 130, and the second regions R2 may be other portions of the active pattern AP that are positioned on opposite sides of the sacrificial gate structure 130 and horizontally separated by the first region R1.

A gate spacer layer 140 may be formed on the entire surface of the substrate 100. The gate spacer layer 140 may conformally cover the sacrificial gate structure 130 and the preliminary channel stacks pCS at a side or opposite sides of each gate structure 130. The gate spacer layer 140 may be formed to have a single layer or a multiple layer. For example, the gate spacer layer 140 may include one or more of a silicon oxide layer, a silicon nitride layer, a silicon oxynitride layer, and a silicon carbonitride layer. The gate spacer layer 140 may be formed by a deposition process such as CVD or ALD.

Figure 7A:
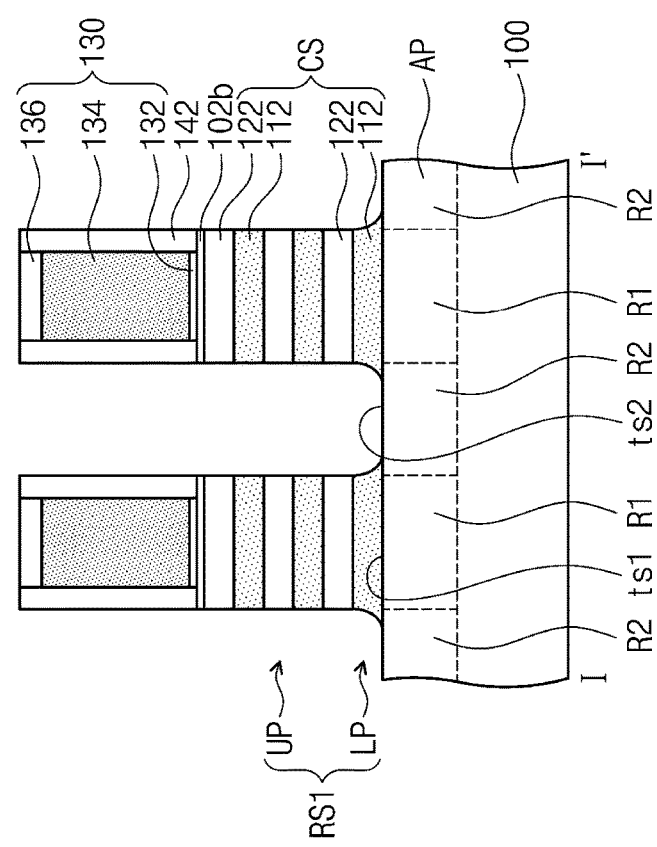
Figure 7B:
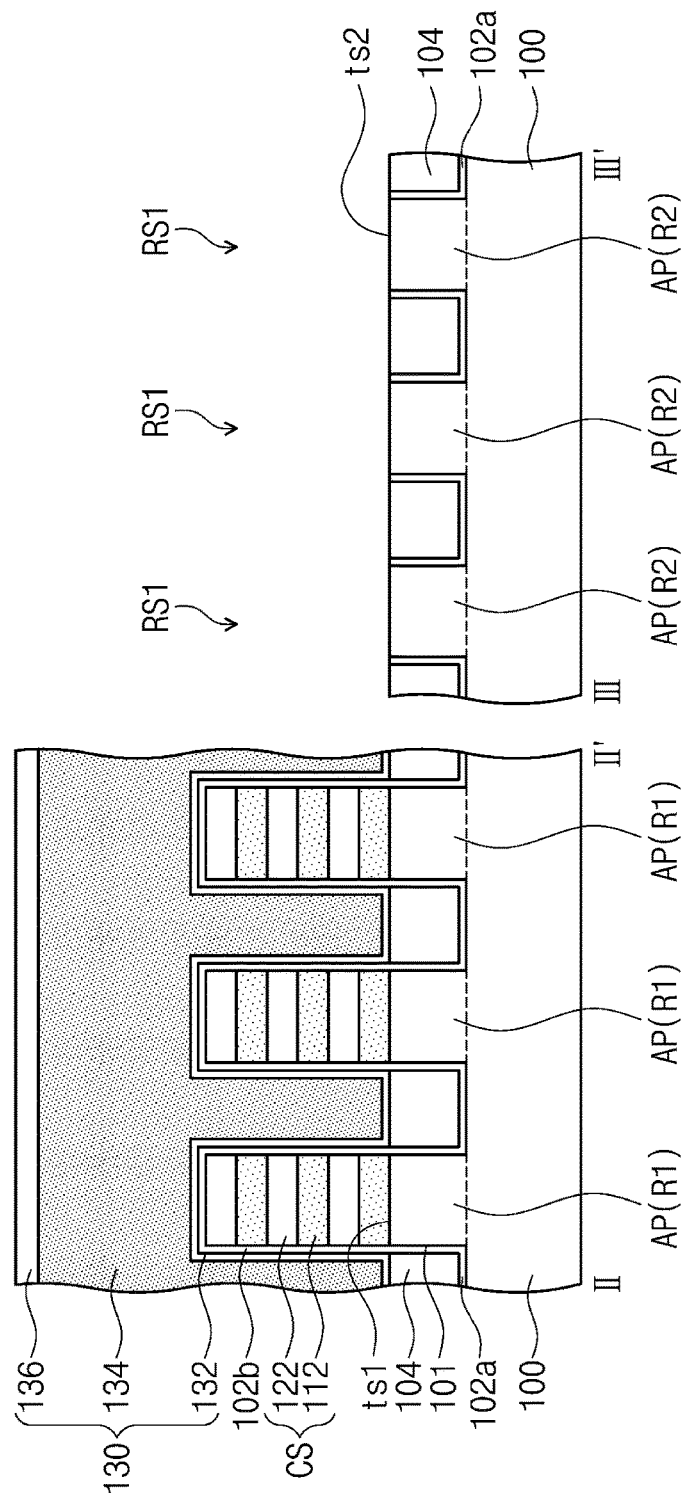

Referring to FIGS. 1, 7A, and 7B, a removal may be performed on the preliminary channel stacks pCS at the side or opposite sides of each sacrificial gate structure 130. For example, the preliminary channel stacks pCS may be partially removed from the second regions R of the active patterns AP. The removal of the preliminary channel stacks pCS may be performed using an anisotropic etching process. In some embodiments, the anisotropic etching process may continue until exposing top surfaces ts2 of the second regions R2. Each of the preliminary channel stacks pCS may thus be divided in the first direction D1 to form channel stacks CS arranged along the first and second directions D1 and D2. First recess regions RS1 may also be formed between the channel stacks CS adjacent to each other in the first direction D1. Each of the first recess regions RS1 may have a U-shaped cross-sectional profile. For example, as viewed in cross-section taken along the first direction D1, the first recess region RS1 may include an upper portion UP whose width is uniform and a lower portion LP whose width decreases as approaching the substrate 100. For example, each of the channel stacks CS may have an upper portion whose width is uniform and a lower portion whose width increases as approaching the substrate 100. In some embodiments, the first recess regions RS1 may have bottom surfaces at the same level and coplanar as that of top surfaces ts1 of the first regions R1 of the active patterns AP in a direction perpendicular to a top surface of the substrate 100, but the present disclosure is not limited thereto. Each of the channel stacks CS may include sacrificial semiconductor patterns 112 formed from the preliminary sacrificial semiconductor patterns 111 and channel semiconductor patterns 122 formed from the preliminary channel semiconductor patterns 121.

When the preliminary channel stacks pCS are removed, the gate spacer layer 140 may also be partially removed to form gate spacers 142 on sidewalls of sacrificial gate structure 130. In addition, the liner layer 102 may be partially removed to form first liner patterns 102a and preliminary second liner patterns 102b. The first liner patterns 102a may be portions of the liner layer 102 that remain in the trenches 101, and the preliminary second liner patterns 102b may be other portions of the liner layer 102 that remain between the sacrificial gate structures 130 and the channel stacks CS, between the gate spacers 142 and the channel sacks CS, and between the sacrificial gate structures 130 and the device isolation patterns 104.

Figure 8A:
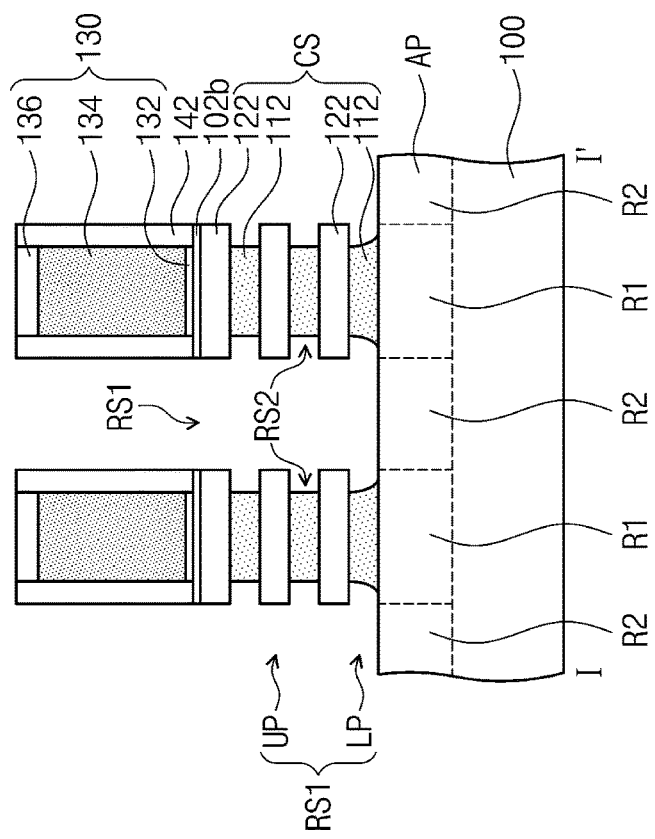
Figure 8B:
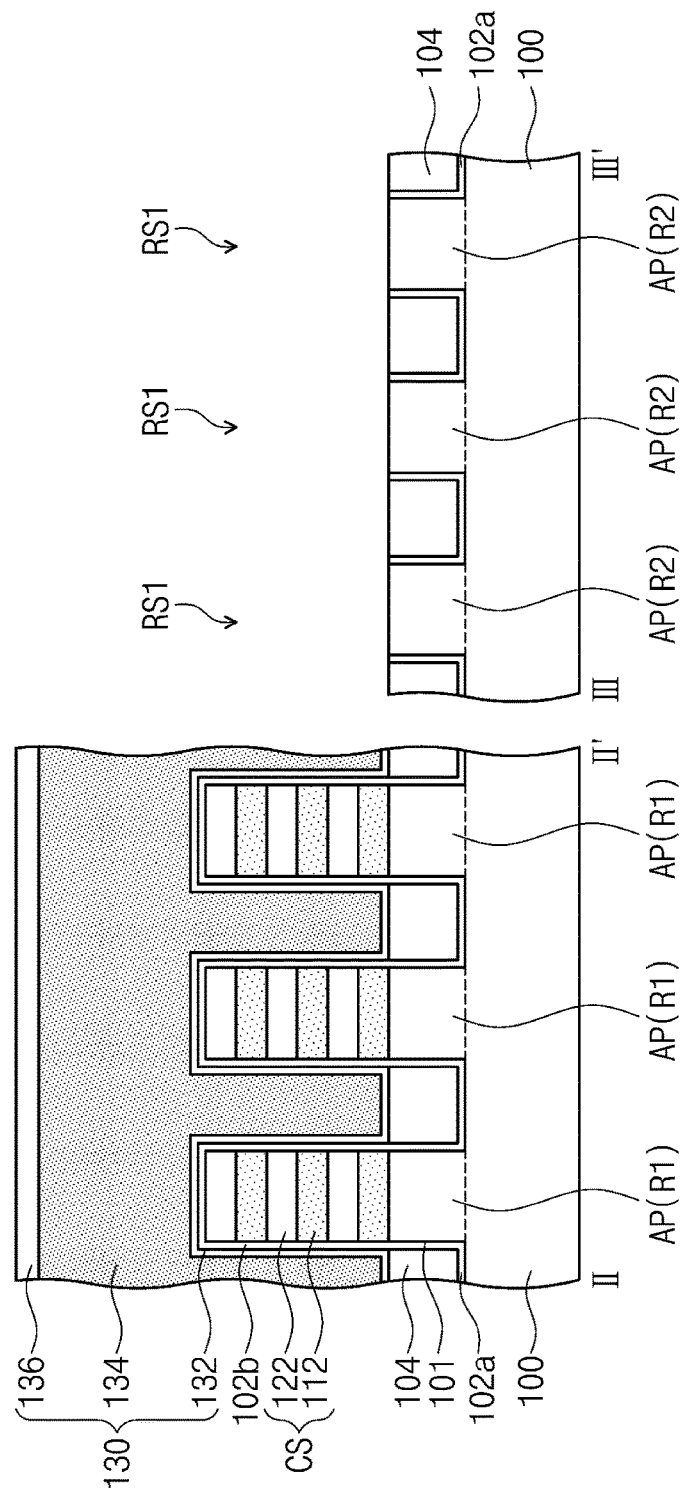

Referring to FIGS. 1, 8A, and 8B, portions of the sacrificial semiconductor patterns 112 may be horizontally removed to form second recess regions RS2 between the channel semiconductor patterns 122 vertically adjacent to each other and between the active pattern AP and a lowermost channel semiconductor pattern 122. The second recess regions RS2 may be formed by performing an etching process that uses an etchant having an etch selectivity to the sacrificial semiconductor patterns 112. For example, when the channel semiconductor patterns 122 include Si and the sacrificial semiconductor patterns 112 include SiGe, the etching process may use an etchant including peracetic acid.

Figure 9A:
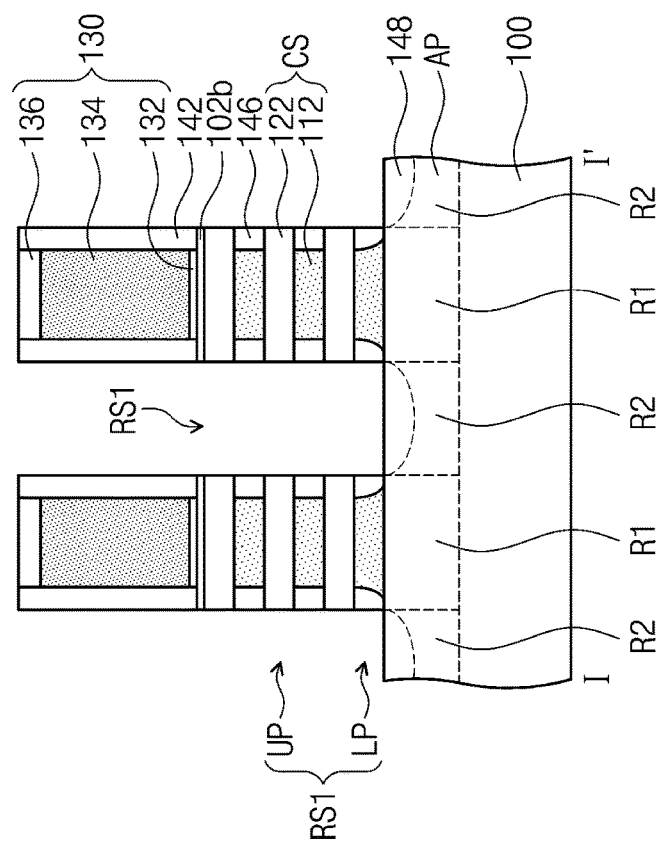
Figure 9B:
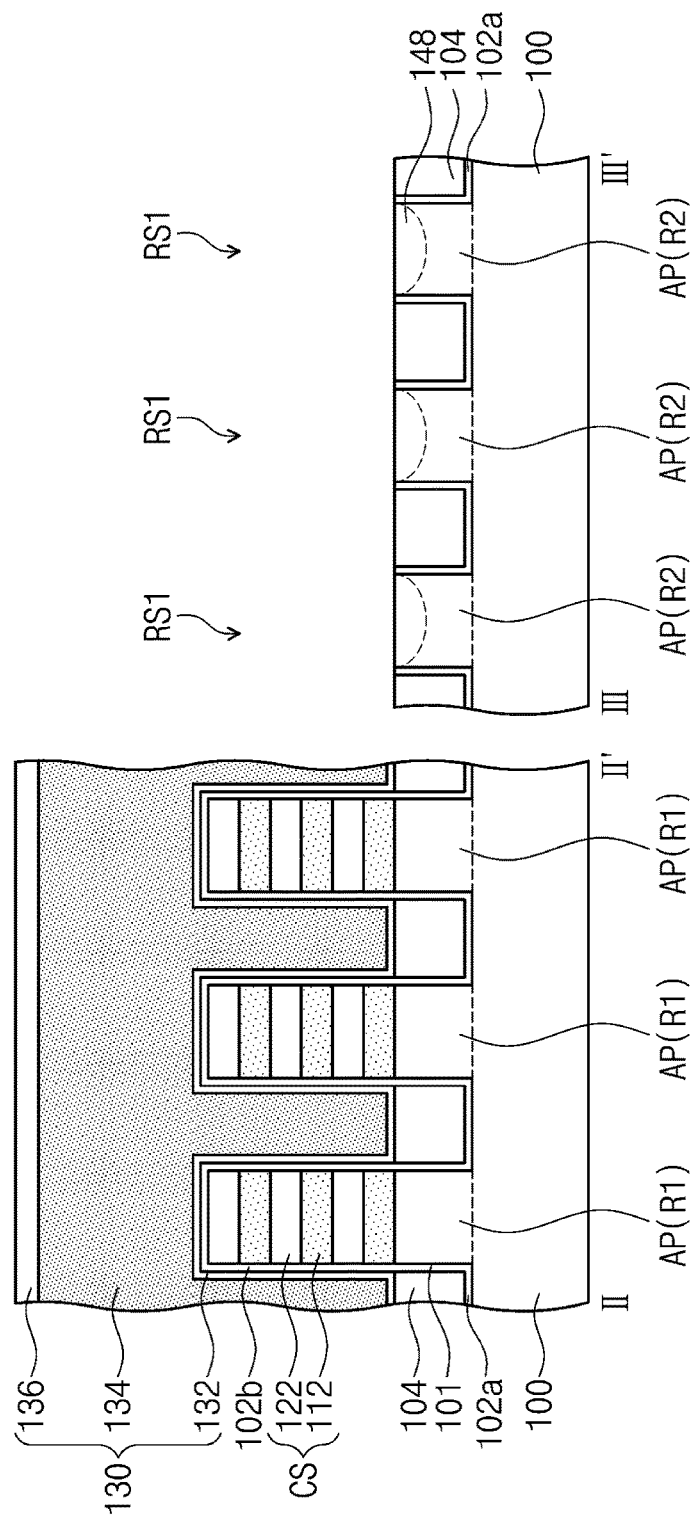

Referring to FIGS. 1, 9A, and 9B, inner spacers 146 may be formed to fill the second recess regions RS2. In some embodiments, the inner spacers 146 may be formed by forming an inner spacer layer to fill the second recess regions RS2 and cover the sacrificial gate structures 130 and then performing an etching process (e.g., etch-back) on the entire surface of the substrate 100. As a result, the inner spaces 146 may be formed from the inner spacer layer that locally remains in the second recess regions RS2. For example, the inner spacer layer may include one or more of a silicon nitride layer, a silicon oxynitride layer, and a silicon carbonitride layer. In some embodiments, the inner spacer layer may be formed of the same material as that of the gate spacer layer 140.

Growth prevention regions 148 may be formed in upper portions of the second regions R2 of the active patterns AP. For example, the growth prevention regions 148 may be formed by doping the second regions R2 with an impurity including one or more of carbon (C), oxygen (O), arsenic (As), and nitrogen (N). An ion implantation process may be adopted to perform the impurity doping. The growth prevention regions 148 may prevent growth of epitaxial layers from the active patterns AP, serving as seed layers, exposed through the first recess regions RS1 when an epitaxial growth process is performed to form source/drain regions SD which are discussed below. In some embodiments, the formation of the growth prevention regions 148 may be preceded by the formation of the inner spacers 146, but the present disclosure is not limited there to. In other embodiments, the formation of the growth prevention regions 148 may be followed by the formation of the inner spacers 146.

Figure 10A:
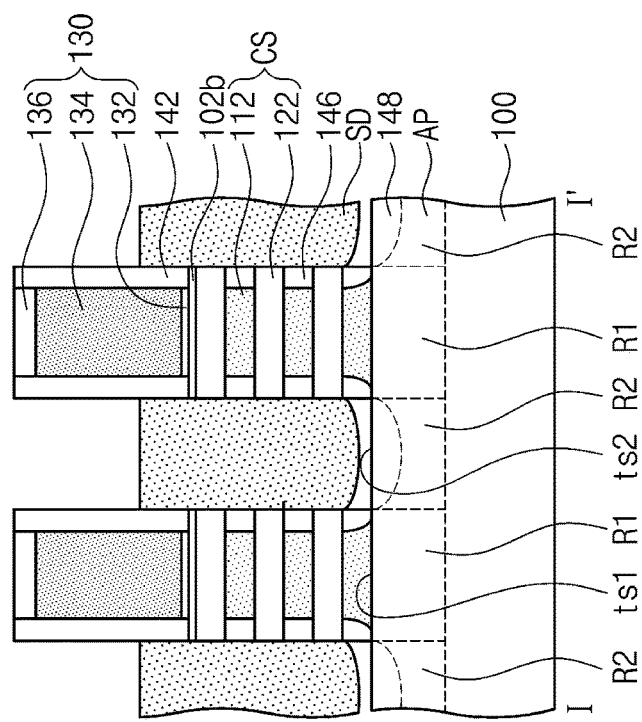
Figure 10B:
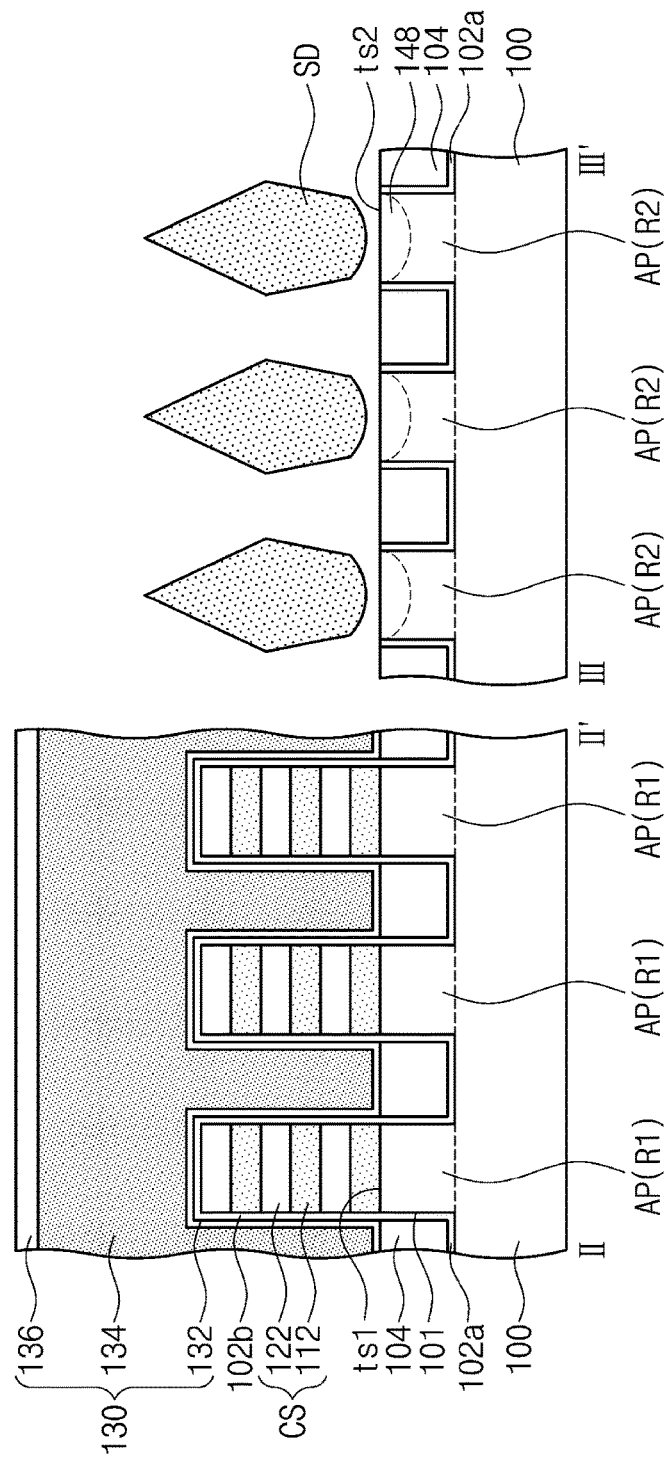

Referring to FIGS. 1, 10A, and 10B, source/drain regions SD may be formed on the second recess regions R2 of the active patterns AP. The source/drain regions SD may be formed using a selective epitaxial growth process in which the channel semiconductor patterns 122 exposed through the first recess regions RS1 are used as seed layers. Since the growth prevention regions 148 are formed in the active patterns AP, when the selective epitaxial growth process is performed, epitaxial layers may be suppressed from growing on exposed top surfaces ts2 of the second regions R2 through the first recess regions RS1. As a result, the source/drain regions SD may be spaced apart from their underlying second regions R2. Epitaxial layers grown from the channel stacks CS adjacent to each other in the first direction D1 may be merged together to fill the upper portion (see UP of FIGS. 9A and 9B) of the first recess region RS1. In some embodiments, the source/drain regions SD may protrude above top surfaces of the channel stacks CS.

The source/drain regions SD may be formed of a semiconductor material that provides the channel semiconductor patterns 122 with one of tensile and compressive strains. For example, when the channel semiconductor patterns 122 include Si, the source/drain regions SD may include SiC, Si, or SiGe. The source/drain regions SD may be doped with N- or P-type impurities after or simultaneously with the selective epitaxial growth process.

Figure 11A:
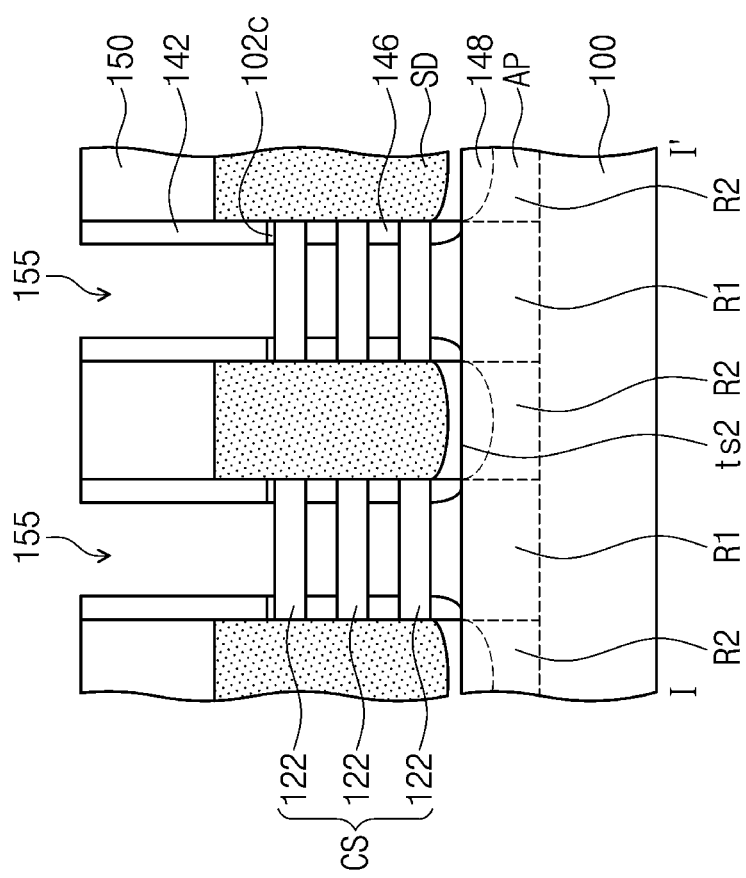
Figure 11B:
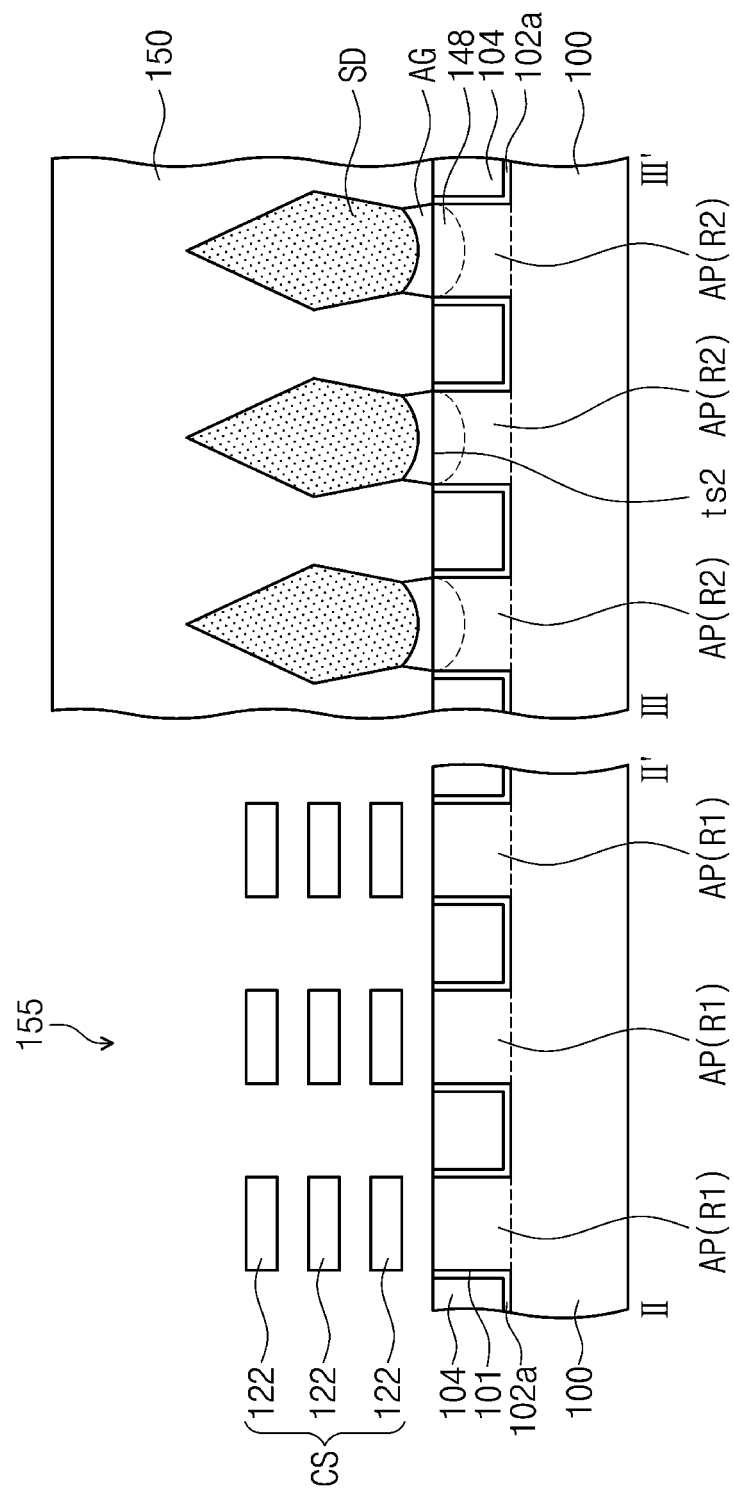

Referring to FIGS. 1, 11A, and 11B, a lower interlayer dielectric layer 150 may be formed on the substrate 100. The lower interlayer dielectric layer 150 may be formed to cover the source/drain regions SD and the sacrificial gate patterns 130. For example, the lower interlayer dielectric layer 150 may be formed of one or more of a silicon oxide layer and a low-k dielectric layer whose dielectric constant is less than that of a silicon oxide layer. When the lower interlayer dielectric layer 150 is formed, air gaps AG may be formed between bottom surfaces of the source/drain regions SD and the top surfaces ts2 of the second regions R2 so that the source/drain regions SD do not contact the top surfaces ts2 of the second regions R2 or the substrate 100. The lower interlayer dielectric layer 150 may define sidewalls of the air gaps AG.

A planarization process may be performed on the lower interlayer dielectric layer 150 until exposing top surfaces of the sacrificial gate patterns 134. The planarization process may include an etch-back process or a chemical mechanical polishing (CMP) process. When the lower interlayer dielectric layer 150 is planarized, the gate mask patterns 136 may also be removed. A selective removal may be performed to remove the sacrificial gate patterns 134 exposed by the planarization process. The etch stop patterns 132 and the preliminary second liner patterns 102b under the sacrificial gate patterns 134 may be removed simultaneously with or separately from the removal of the sacrificial gate patterns 134. Thus, gate regions 155 may be formed to expose the channel stacks CS between the gate spacers 142. For example, each of the gate regions 155 may expose the sacrificial semiconductor patterns 112 and the channel semiconductor patterns 122. The preliminary second liner patterns 102b may be patterned to form second liner patterns 102c positioned under the gate spacers 142. The second liner pattern 102c may be disposed between the gate spacer 142 and an uppermost channel semiconductor pattern 122, and extend in the second direction D2 along a bottom surface of the gate spacer 142.

A selective etching process may be performed to remove the sacrificial semiconductor patterns 112 exposed through the gate region 155. For example, when the sacrificial semiconductor patterns 122 include SiGe and the channel semiconductor patterns 112 include Si, an etchant including peracetic acid may be used to perform the selective etching process. The etchant may further include an HF solution and a deionized water. When the sacrificial semiconductor patterns 112 are selectively removed, the source/drain regions SD may be protected by the inner spacers 146 and the lower interlayer dielectric layer 150. In consequence, the gate region 155 may extend empty spaces where the sacrificial semiconductor patterns 112 are removed, and the channel stacks CS may consist of only the channel semiconductor patterns 122 vertically stacked and spaced apart from each other.

Referring back to FIGS. 2A and 2B, a gate dielectric pattern GD and a gate electrode GE may be formed in the gate region 155. In detail, a gate dielectric layer and a gate conductive layer may be sequentially formed in the gate region 155, and then a planarization process may be performed to form a preliminary gate dielectric pattern and a preliminary gate electrode in the gate region 155. The preliminary gate dielectric pattern and the preliminary gate electrode may fill the gate region 155 and be formed to surround outer surfaces of the channel semiconductor patterns 122. The gate dielectric layer may be formed of one or more of a silicon oxide layer, a silicon oxynitride layer, and a high-k dielectric layer whose dielectric constant is greater than that of a silicon oxide layer. The gate conductive layer may be formed of one or more of doped semiconductor, conductive metal nitride, and metal.

The preliminary gate dielectric pattern and the preliminary gate electrode may be partially recessed to form the gate dielectric pattern GD and the gate electrode GE, and a gate capping pattern GP may be formed to lie on the gate dielectric pattern GD and the gate electrode GE and to fill a remainder of the gate region 155. For example, the gate capping pattern GP may be formed of one or more of a silicon oxide layer, a silicon nitride layer, and a silicon oxynitride layer.

An upper interlayer dielectric layer (not shown) may be formed on the lower interlayer dielectric layer 150. Contact plugs (not shown) may be formed to penetrate the upper interlayer dielectric layer, the lower interlayer dielectric layer 150, and/or the gate capping pattern GP, and coupled to the gate electrodes GE or the source/drain regions SD. Wiring lines (not shown) may be formed on the upper interlayer dielectric layer and coupled to the contact plugs. A semiconductor device shown in FIGS. 2A and 2B may therefore be fabricated.

Figure 12A:
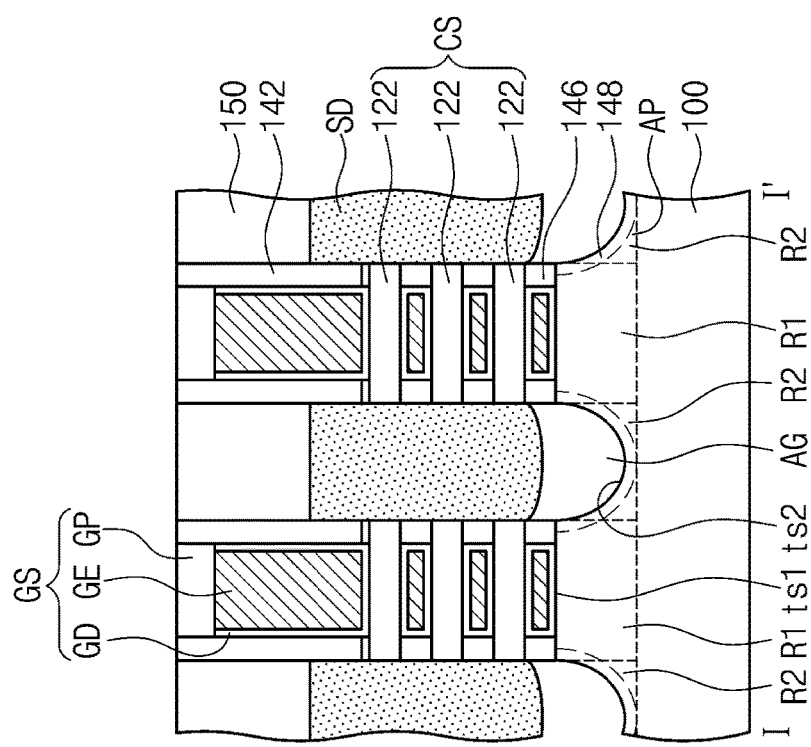
FIG. 12A is a cross-sectional view taken along line I-I' of FIG. 1 for explaining a semiconductor device according to exemplary embodiments of the present disclosure.
Figure 12B:
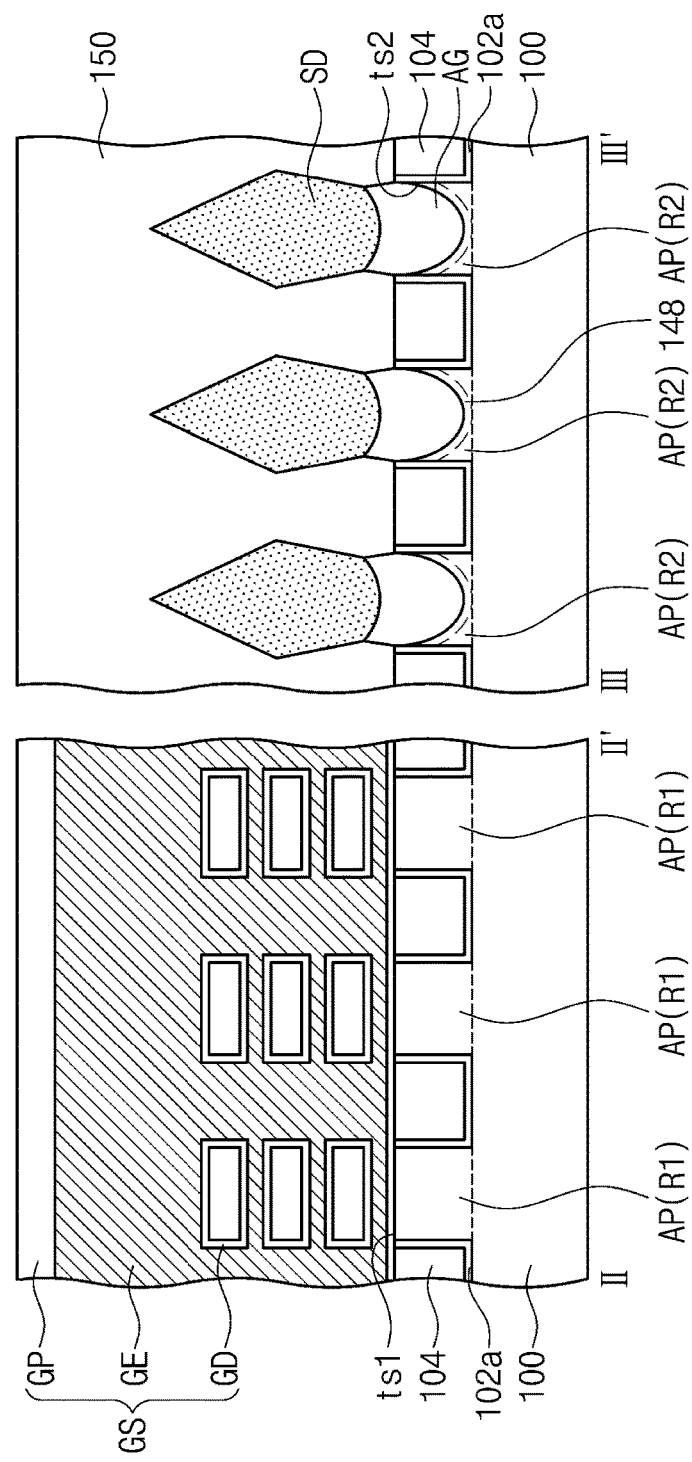
FIG. 12B is a cross-sectional view taken along lines II-II' and III-III' of FIG. 1.

FIG. 12A is a cross-sectional view taken along line I-I' of FIG. 1 for explaining a semiconductor device according to exemplary embodiments of the present disclosure. FIG. 12B is a cross-sectional view taken along lines II-II' and III-III' of FIG. 1. For simplicity of the description, a repetitive detailed explanation will be omitted and differences from the embodiment in FIGS. 2A and 2B will be principally discussed below.

Referring to FIGS. 1, 12A, and 12B, the second regions R2 of the active patterns AP may be recessed on their upper portions. For example, the top surfaces ts2 of the second regions R2 may be lower than the top surfaces ts1 of the first regions R1 and higher than bottom surfaces of the device isolation patterns 104. The top surfaces ts2 of the second regions R2 may be concavely recessed toward the substrate 100. The bottom surfaces of the air gaps AG may be defined by the top surfaces ts2 of the second regions R2. The growth prevention regions 148 may be provided within the recessed second regions R2. For example, the growth prevention regions 148 may be impurity regions formed by doping the recessed second regions R2 with an impurity including one or more of carbon (C), oxygen (O), arsenic (As), and nitrogen (N). As viewed in cross-section, each of the growth prevention regions 148 may have a "U" shape surrounding the top surface ts2 of the second region R2. The source/drain regions SD may be disposed on the recessed second regions R2, and spaced apart from the top surfaces ts2 of the recessed second regions R2. The air gaps AG may be provided between the bottom surfaces of the source/drain regions SD and the top surfaces ts2 of the recessed second regions R2 so that the source/drain regions SD do not contact the growth prevention regions 148.

The gate electrode GE may have, as shown in FIG. 12A, sidewalls substantially perpendicular to the top surface of the substrate 100. For example, as viewed in cross-section taken along the first direction D1, the gate electrode GE may have a substantially uniform width. The uniform width of the gate electrode GE may cause the semiconductor device to have improved distribution of electrical characteristics. Other configurations are substantially identical or similar to those discussed with reference to FIGS. 2A and 2B. The discussion related to the embodiment of FIG. 3 may also be applicable to the current embodiment.

Figure 13A:
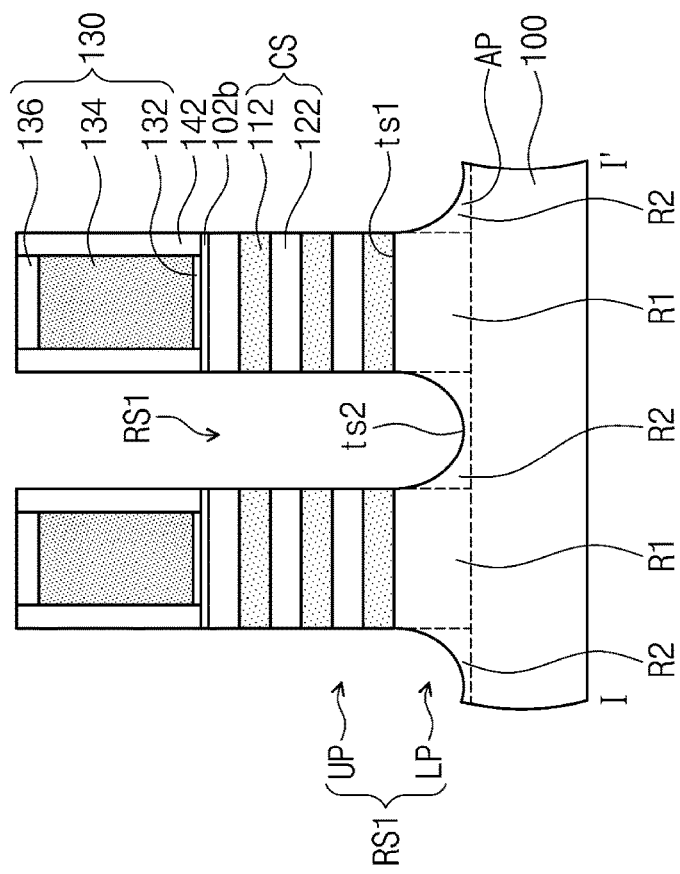
FIGS. 13A and 14A are cross-sectional views corresponding to line I-I' of FIG. 1 for explaining a method of fabricating a semiconductor device according to exemplary embodiments of the present disclosure.
Figure 13B:
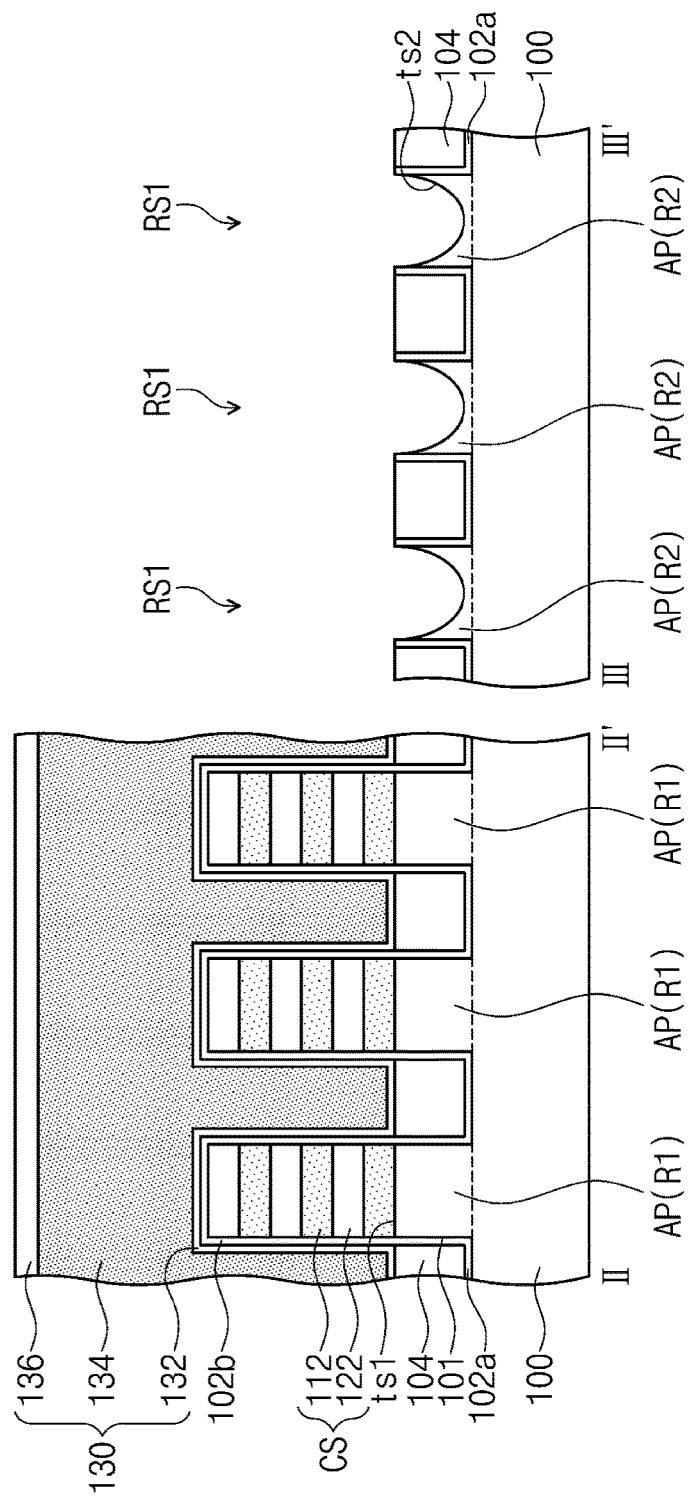
FIGS. 13B and 14B are cross-sectional views each corresponding to lines II-II' and III-III' of FIG. 1.
Figure 14A:
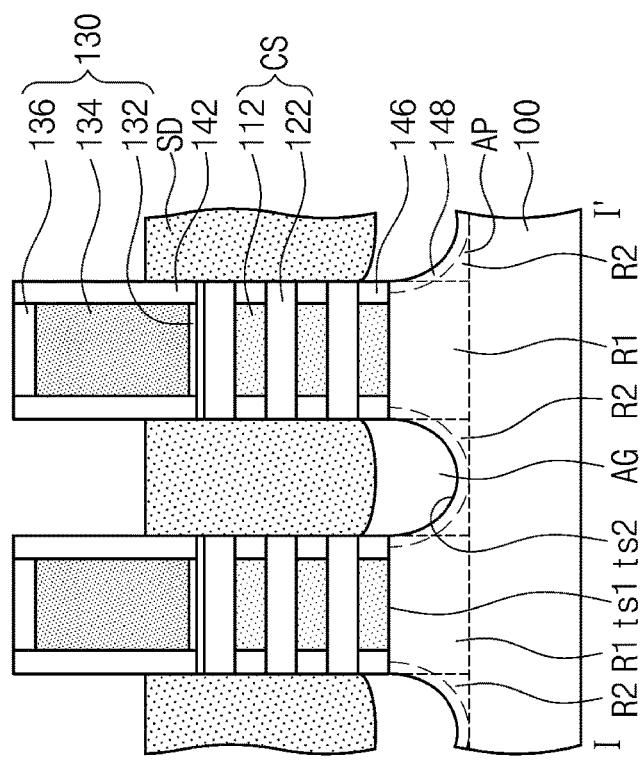
Figure 14B:
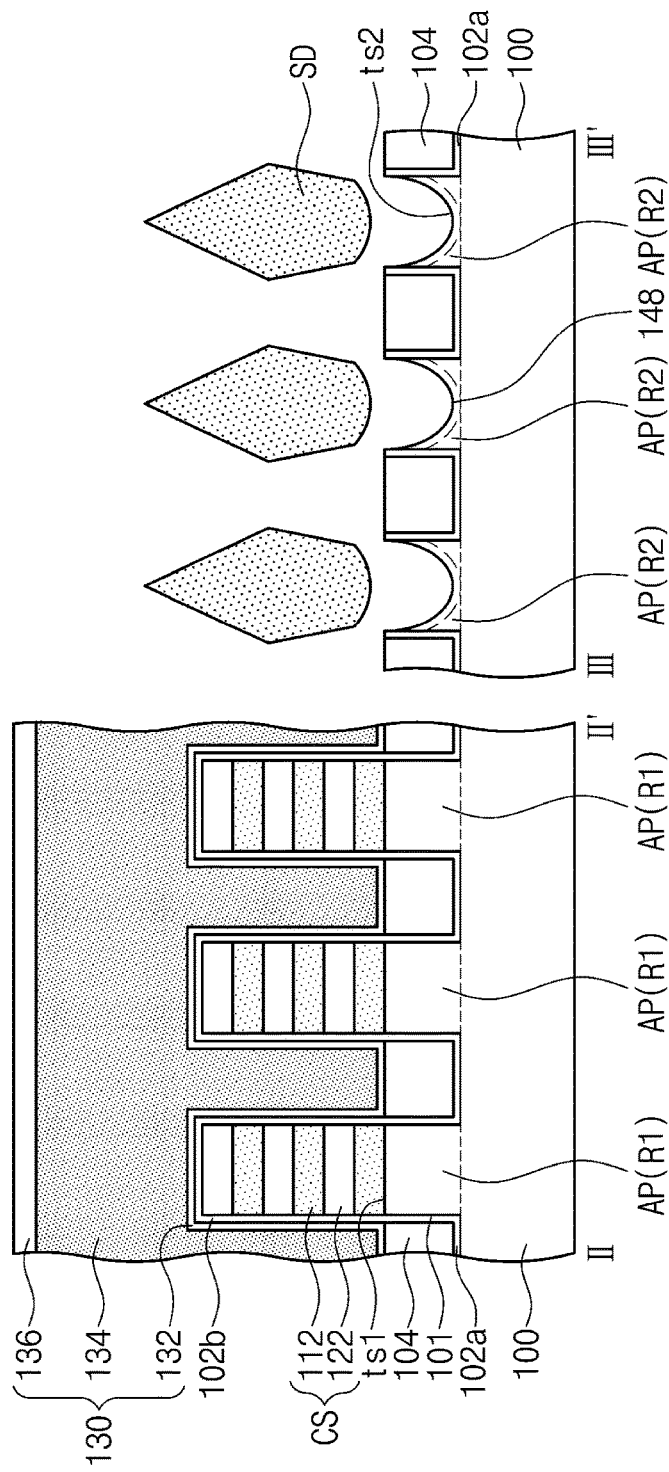

FIGS. 13A and 14A are cross-sectional views corresponding to line I-I' of FIG. 1 for explaining a method of fabricating a semiconductor device according to exemplary embodiments of the present disclosure. FIGS. 13B and 14B are cross-sectional views each corresponding to lines II-II' and III-III' of FIG. 1. For brevity of the description, a repetitive description will be omitted.

Referring to FIGS. 1, 13A, and 13B, an anisotropic etching process may be performed on a resultant structure of FIGS. 6A and 6B such that the preliminary channel stacks pCS may be removed from the side or opposite sides of each sacrificial gate structure 130. In some embodiments, the anisotropic etching process may continue until upper portions of the second regions R2 are recessed to a predetermined depth. As a result, each of the preliminary channel stacks pCS may be divided in the first direction D1 to form the channel stacks CS arranged along the first and second directions D1 and D2. The first recess regions RS1 may be formed between the channel stacks CS adjacent to each other in the first direction D1, and extend into the second regions R2. For example, the first recess regions RS1 may have bottom surfaces lower than the top surfaces ts1 of the first regions R1. Each of the first recess regions RS1 may have a U-shaped cross-sectional profile. For example, as viewed in cross-section taken along the first direction D1, the first recess region RS1 may include an upper portion UP whose width is uniform and a lower portion LP whose width decreases as approaching the substrate 100. The upper portion UP of the first recess region RS1 may be defined by opposing sidewalls of the channel stacks CS adjacent to each other in the first direction D1, and the lower portion LP of the first recess region RS1 may be defined by the top surface ts2 of the recessed second region R2. In consequence, each of the channel stacks CS may be formed to have a uniform width, and thus the gate electrode GE of the gate structure GS may also be formed to have a uniform width in a subsequent process.

When the preliminary channel stacks pCS are recessed, the gate spacer layer 140 may also be removed to form gate spacers 142 on the sidewalls of the sacrificial gate structures 130. In addition, the liner layer 102 may be partially removed to form the first liner patterns 102a and the preliminary second liner patterns 102b.

Referring to FIGS. 1, 14A, and 14B, the inner spacers 146 may be locally formed between the channel semiconductor patterns 122 vertically adjacent to each other and between the lowermost channel semiconductor pattern 122 and the active pattern AP. The growth prevention regions 148 may be formed by doping the upper portions of the second regions R2 with an impurity including one or more of carbon (C), oxygen (O), arsenic (As), and nitrogen (N). The formation of the inner spacers 146 and the growth prevention regions 148 may be identical or similar to that discussed with reference to FIGS. 8 and 9.

The source/drain regions SD may be formed on and spaced apart from the second regions R2. The source/drain regions SD may be formed using an epitaxial growth process in which the channel semiconductor patterns 122 are used as seed layers. The growth prevention regions 148 may prevent growth of epitaxial layers from the second regions R2 serving as seed layers when the selective growth process is performed. Epitaxial layers grown from the channel stacks CS adjacent to each other in the first direction D1 may be merged together to fill the upper portion (see UP of FIGS. 13A and 13B) of the first recess region RS1. In some embodiments, the source/drain regions SD may protrude above top surfaces of the channel stacks CS. The source/drain regions SD may include a material the same as that discussed with reference to FIGS. 10A and 10B.

Thereafter, processes identical or similar to those discussed with reference to FIGS. 11A and 11B and those discussed with reference to FIGS. 2A and 2B may be performed to fabricate the semiconductor device as shown in FIGS. 12A and 12B.

Figure 15A:
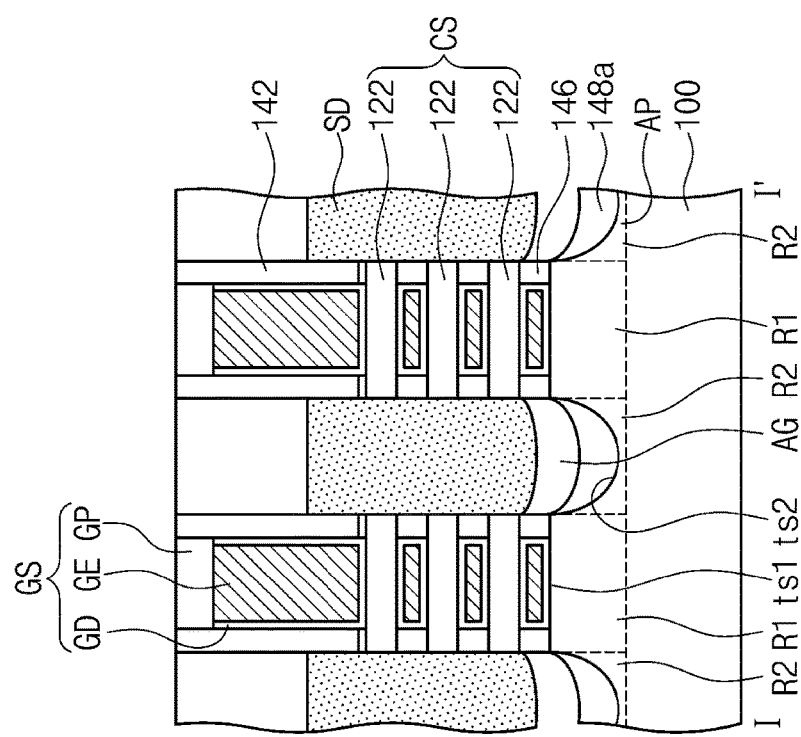
FIG. 15A is a cross-sectional view taken along line I-I' of FIG. 1 for explaining a semiconductor device according to exemplary embodiments of the present disclosure.
Figure 15B:
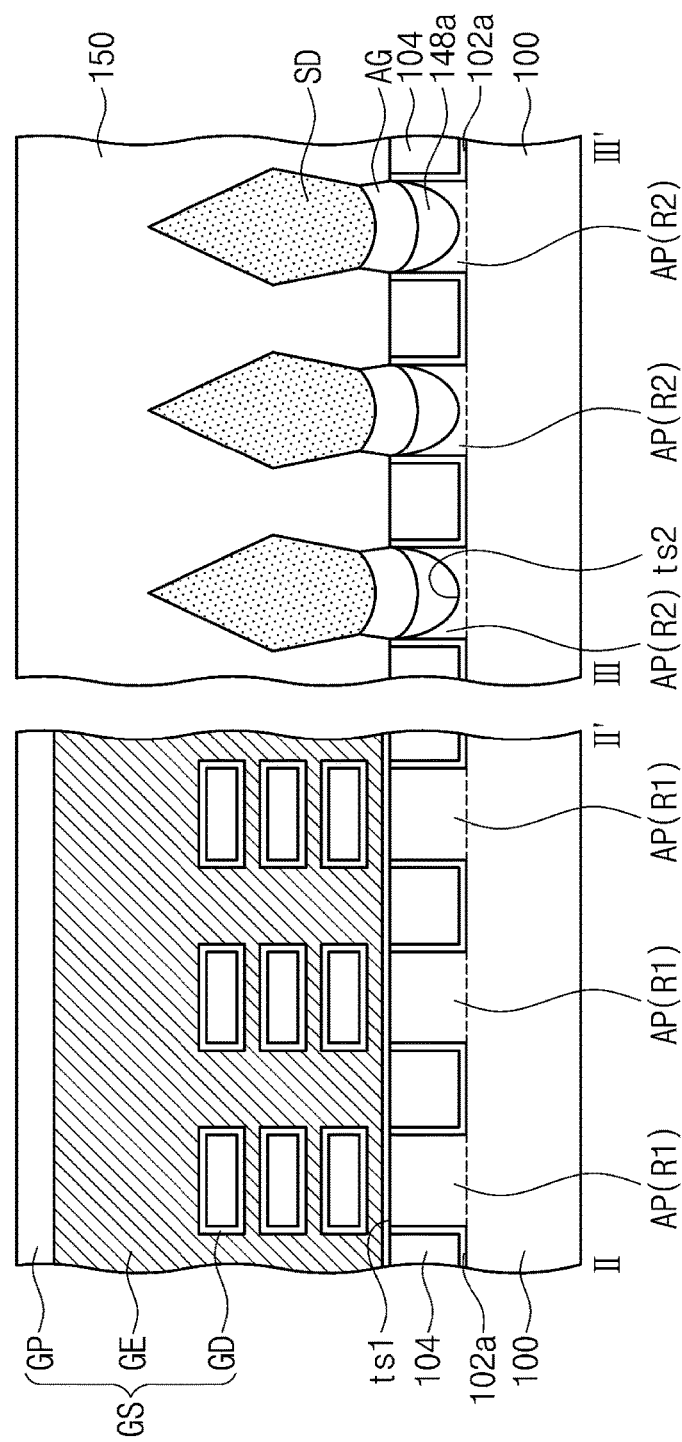
FIG. 15B is a cross-sectional view taken along lines II-II' and III-III' of FIG. 1.

FIG. 15A is a cross-sectional view taken along line I-I' of FIG. 1 for explaining a semiconductor device according to exemplary embodiments of the present disclosure. FIG. 15B is a cross-sectional view taken along lines II-II' and III-III' of FIG. 1. For simplicity of the description, a repetitive detailed explanation will be omitted and differences from the embodiment in FIGS. 2A and 2B and the embodiment in FIGS. 12A and 12B will be principally discussed below.

Referring to FIGS. 1, 15A, and 15B, the second regions R2 may be recessed on their upper portions, and growth prevention regions 148a may be provided on the top surfaces ts2 of the recessed second regions R2. In some embodiments, the growth prevention regions 148a may be insulation layers disposed on the top surfaces ts2 of the recessed second regions R2. The growth prevention regions 148a may include the same material as that of the inner spacers 146. For example, the growth prevention regions 148a may include one or more of a silicon nitride layer, a silicon oxynitride layer, and a silicon carbonitride layer. In some embodiments, each of the growth prevention regions 148a may be positioned under the lowermost channel semiconductor patterns 122 and connected to the inner spacers 146 adjacent to each other in the first direction D1. Likewise the growth prevention regions 148 discussed in the foregoing embodiments, the growth prevention regions 148a may prevent growth of epitaxial layers from the second regions R2 serving as seed layers when an epitaxial growth process is performed to form the source/drain regions SD. The source/drain regions SD may be disposed on the recessed second regions R2, and spaced apart from top surfaces of the growth prevention regions 148a. The air gaps AG may be provided between the bottom surfaces of the source/drain regions SD and the top surfaces of the growth prevention regions 148a so that the source/drain regions do not contact the growth prevention regions 148. Other configurations are substantially identical or similar to those discussed with reference to FIGS. 12A and 12B. The discussion related to the embodiment of FIG. 3 may also be applicable to the current embodiment.

Figure 16A:
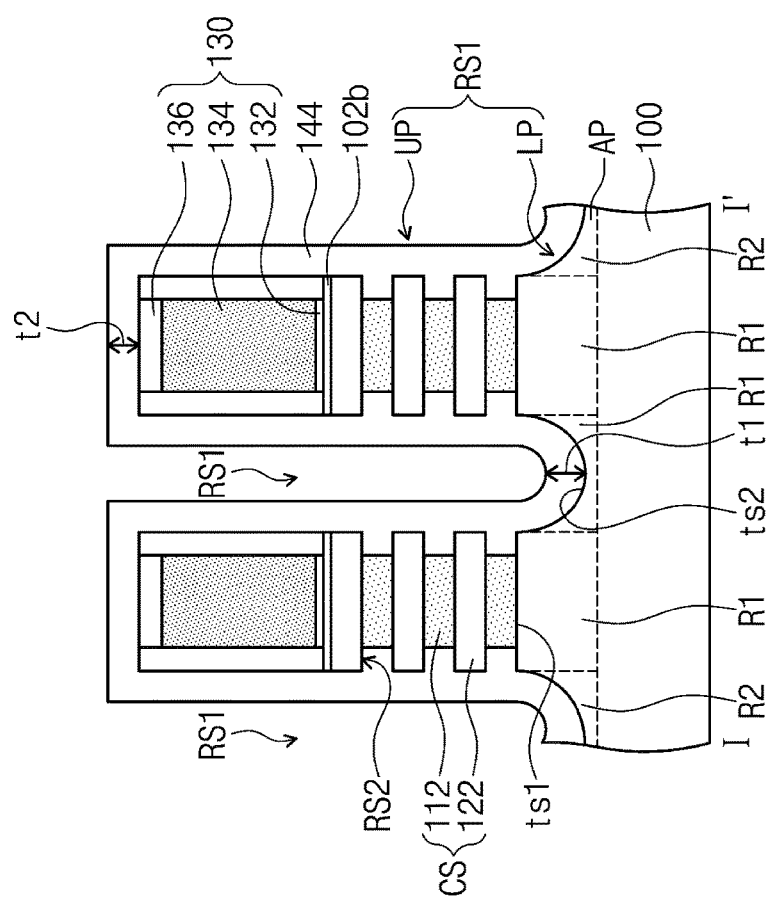
FIGS. 16A, 17A, and 18A are cross-sectional views corresponding to line I-I' of FIG. 1 for explaining a method of fabricating a semiconductor device according to exemplary embodiments of the present disclosure.
Figure 16B:
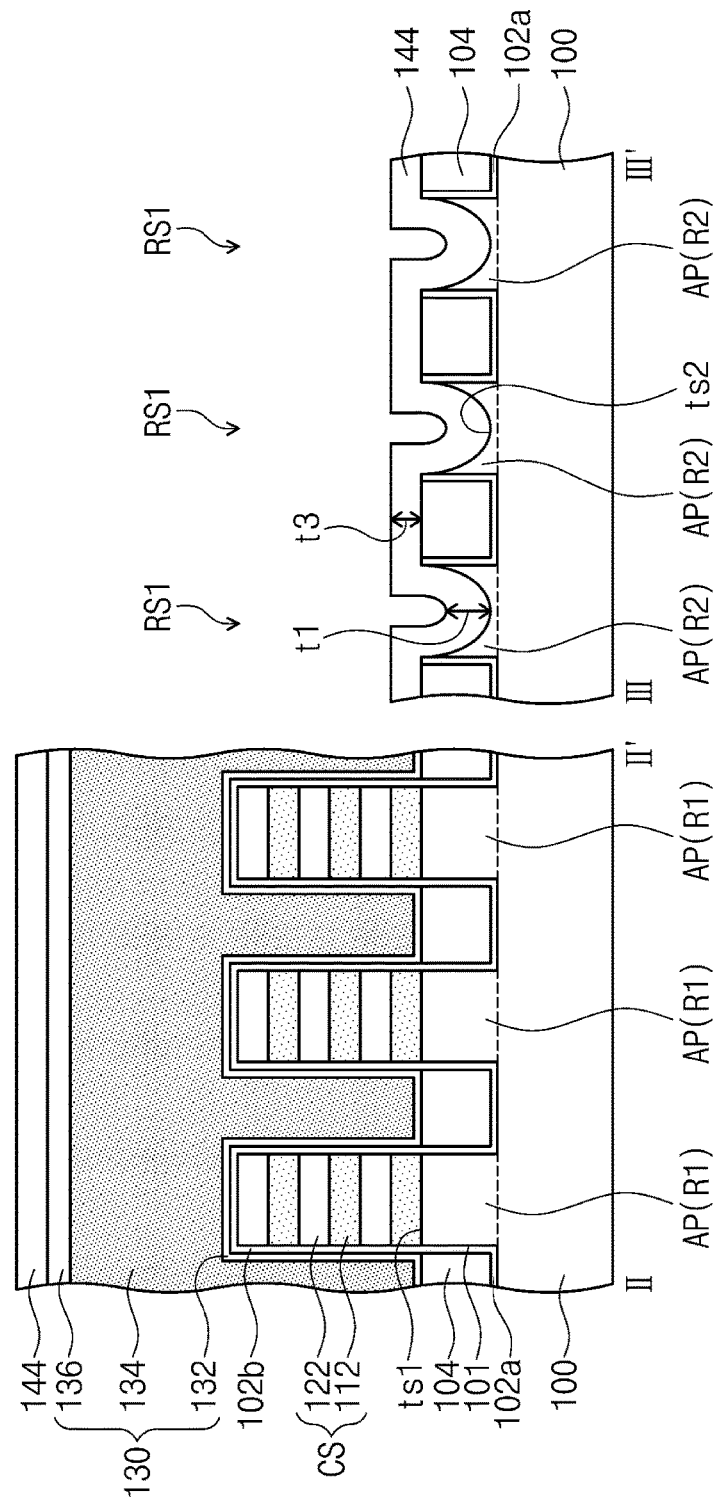
FIGS. 16B, 17B, and 18B are cross-sectional views each corresponding to lines II-II' and III-III' of FIG. 1.
Figure 17A:
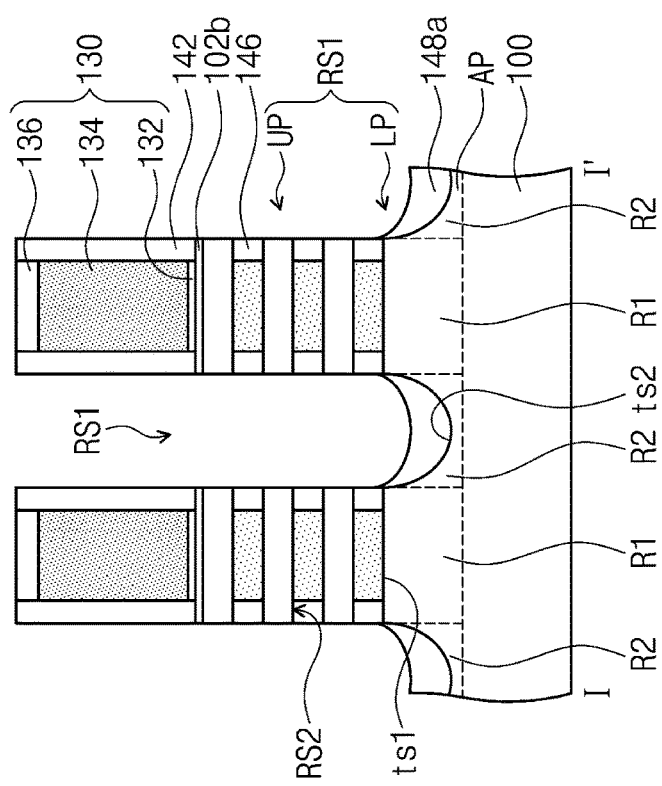
Figure 17B:
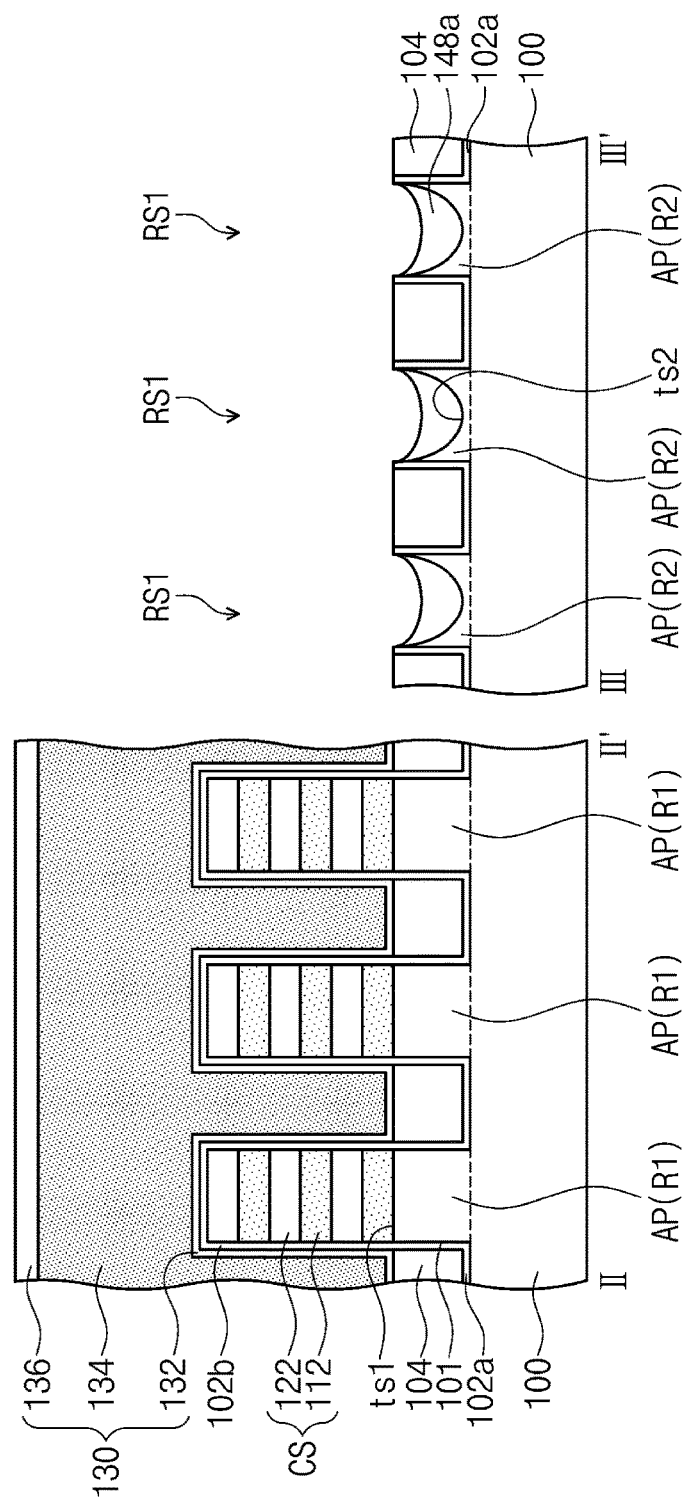
Figure 18A:
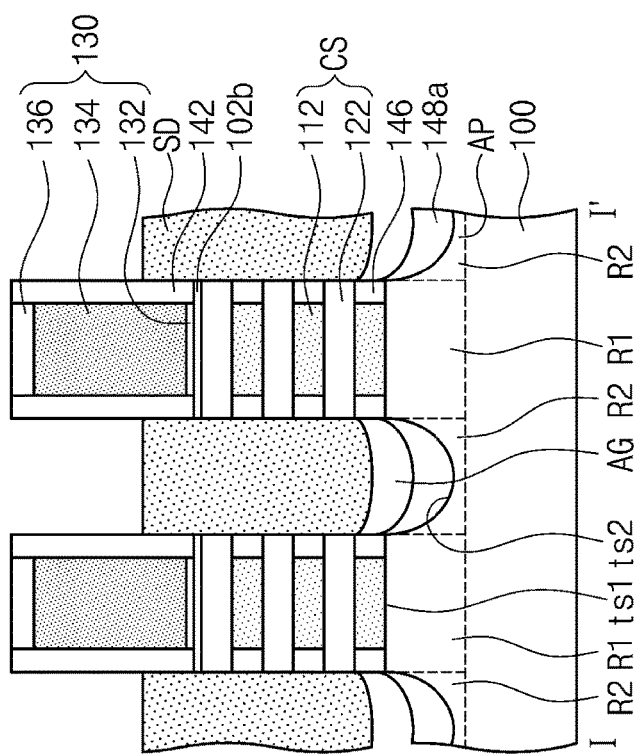
Figure 18B:
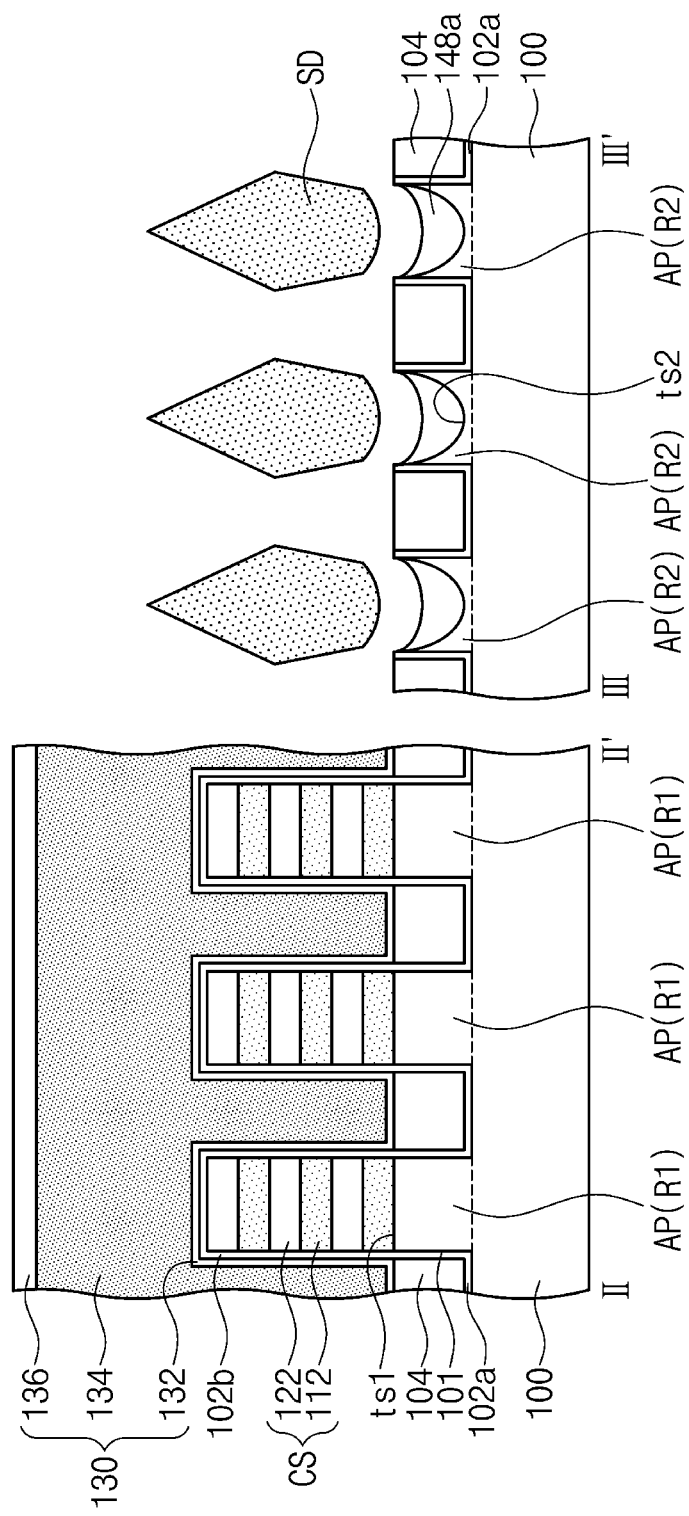

FIGS. 16A, 17A, and 18A are cross-sectional views corresponding to line I-I' of FIG. 1 for explaining a method of fabricating a semiconductor device according to exemplary embodiments of the present disclosure. FIGS. 16B, 17B, and 18B are cross-sectional views each corresponding to lines II-II' and III-III' of FIG. 1. For brevity of the description, a repetitive description will be omitted.

Referring to FIGS. 1, 16A, and 16B, an inner spacer layer 144 may be formed on a resultant structure of FIGS. 8A and 8B. The inner spacer layer 144 may fill the second recess regions RS2 and cover the sacrificial gate structures 130. In some embodiments, since the lower portions LP of the first recess regions RS1 are formed to have a width that decreases as approaching the substrate 100, the inner spacer layer 144 may have a thickness that is greater in the lower portions LP of the first recess regions RS1 than on any other components. For example, the inner spacer layer 144 may have a first thickness t1 on bottom surfaces of the first recess regions RS1, a second thickness t2 on top surfaces of the sacrificial gate structures 130, and a third thickness t3 on top surfaces of the device isolation patterns 104. In some embodiments, the first thickness t1 may be greater than the second thickness t2 and/or the third thickness t3. In some embodiments, the second thickness t2 and the third thickness t3 may have the same thickness and in some embodiments, the second thickness t2 and the third thickness t3 may have different thicknesses. The inner spacer layer 144 may include one or more of a silicon nitride layer, a silicon oxynitride layer, and a silicon carbonitride layer.

Referring to FIGS. 1, 17A, and 17B, an etching process (e.g., etch-back) may be performed on the entire surface of the substrate 100. The etching process may be performed until exposing top surfaces and sidewalls of the sacrificial gate structures 130 and top surfaces of the device isolation patterns 104. As a result, portions of the inner spacer layer 144 may locally remain in the second recess regions RS2 to form the inner spacers 146. In addition, other portions of the inner spacer layer 144 may remain in the lower portions LP of the first recess regions RS1 to form the growth prevention regions 148a. In some embodiments, each of the growth prevention regions 148a may be formed positioned under the lowermost channel semiconductor pattern 122 and connected to the inner spacers 146 adjacent to each other in the first direction D1.

Referring to FIGS. 1, 18A, and 18B, the source/drain regions SD may be formed on and spaced apart from the second regions R2. The source/drain regions SD may be formed using an epitaxial growth process in which the channel semiconductor patterns 122 are used as seed layers. The growth prevention regions 148a may prevent growth of epitaxial layers from the second regions R2 serving as seed layers when the selective growth process is performed. Epitaxial layers grown from the channel stacks CS adjacent to each other in the first direction D1 may be merged together to fill the upper portion (see UP of FIGS. 13A and 13B) of the first recess region RS1. In some embodiments, the source/drain regions SD may protrude above the top surfaces of the channel stacks CS. Thereafter, processes identical or similar to those discussed with reference to FIGS. 11A and 11B and those discussed with reference to FIGS. 2A and 2B may be performed to fabricate the semiconductor device as shown in FIGS. 15A and 15B.

Figure 19:
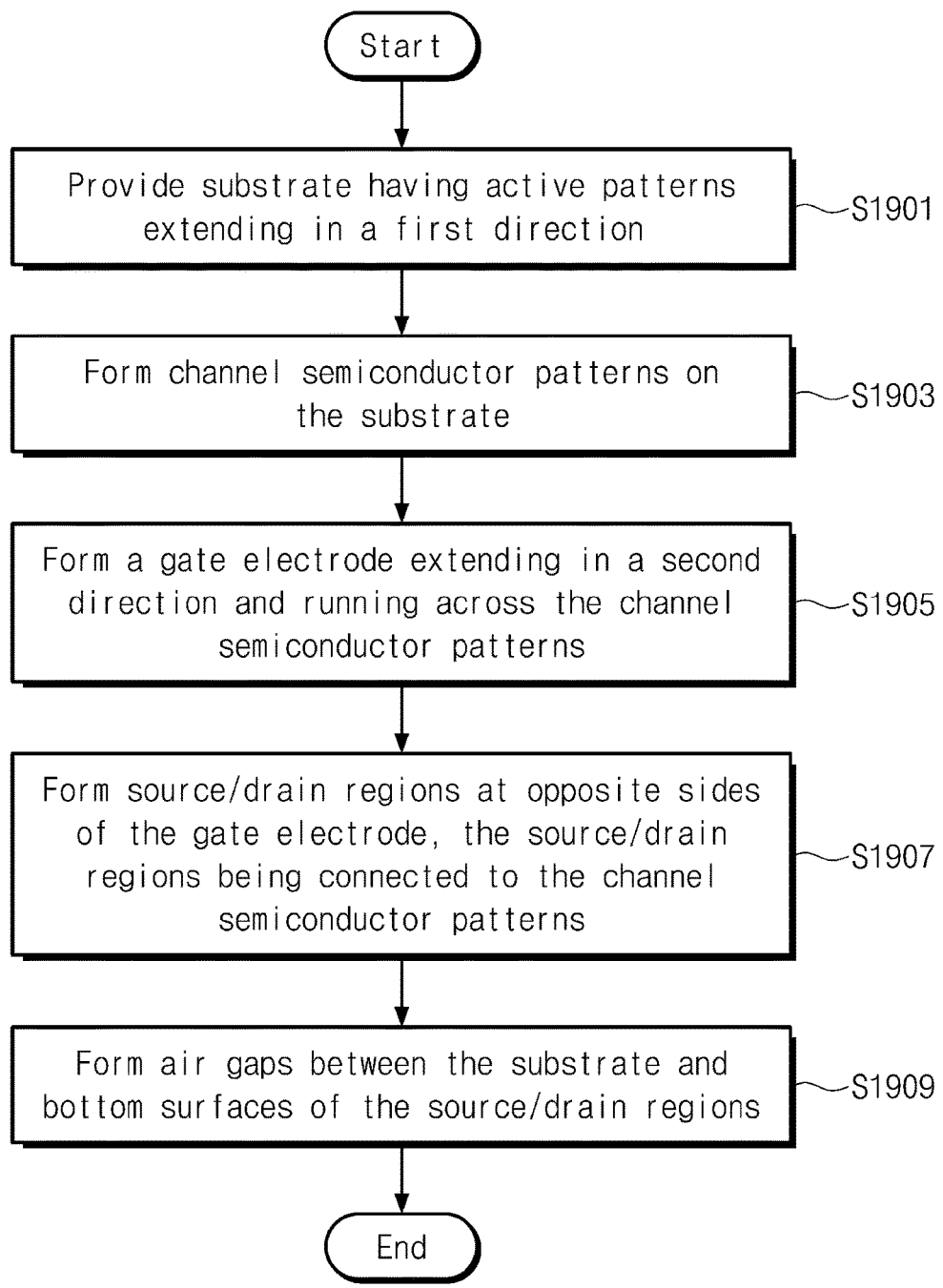
FIG. 19 is flow chart showing a method of manufacturing a semiconductor device according to exemplary embodiments of the present disclosure.

FIG. 19 is flow chart showing a method of manufacturing semiconductor device according to exemplary embodiments of the present disclosure.

In step S1901, a substrate, e.g., a wafer W is provided. The substrate may be a substrate 100 according to the exemplary embodiments as disclosed above. The substrate 100 may include active patterns AP. The active patterns AP may have a bar or linear shape extending in a first direction D1, and be arranged spaced apart from each other in a second direction D2 crossing (e.g., perpendicular to) the first direction D1. The active patterns AP may have a fin shape protruding in a third direction D3 perpendicular to a top surface of the substrate 100. The active patterns AP may be portions of the substrate 100.

In step S1903, channel semiconductor patterns may be formed on the substrate 100. The channel semiconductor patterns may be the channel semiconductor patterns 122 according to the exemplary embodiments as disclosed above. The channel semiconductor patterns 122 are vertically stacked and spaced apart from each other on the substrate 100. In some embodiments, the channel semiconductor patterns 122 included in a single channel stack CS may be spaced apart from the substrate 100 (or the active pattern AP) at different distances from each other in the third direction D3. Each of the channel semiconductor patterns 122 may be embodied in a rectangular parallelepiped nanosheet shape.

In step S1905, a gate electrode GE may be formed on a first region R1 of each of the active pattern AP in a second direction D2 crossing the first direction D1 and running across the channel semiconductor patterns 122. The gate electrode GE may extend in the second direction D2 and cover a top surface of an uppermost channel semiconductor pattern 122. The gate electrode GE may include doped semiconductor, conductive metal nitride, and/or metal. For example, the gate electrode GE may include metal nitride such as TiN, WN, and TaN, and/or metal such as Ti, W, and Ta. The gate electrode GE may have an upper sidewall substantially perpendicular to the top surface of the substrate 100 and a lower sidewall having a concave slope.

In step S1907, a source/drain regions SD may be formed on the active patterns AP at opposite sides of the gate electrode GE. The source/drain regions SD may be formed on a second regions R2 of the active patterns AP. A pair of neighboring source/drain regions SD may be connected to the channel semiconductor patterns 122. The source/drain regions SD may include, for example, an epitaxially grown Si layer, an epitaxially grown SiC layer or an embedded SiGe (eSiGe) structure that includes a plurality of epitaxially grown SiGe layers. The source/drain regions SD may provide strain to the channel semiconductor patterns 122.

In step S1909, air gaps AG between the substrate 100 and bottom surfaces of the source/drain regions SD may be formed so that bottom surfaces of the source/drain regions SD do not contact the substrate 100. The air gaps AG may be provided between the bottom surfaces of the source/drain regions SD and top surfaces ts2 of the second regions R2 of the active patterns AP. The air gap AG may be a substantially empty space where no solid material is provided. For example, the air gap AG may have a top surface defined by the bottom surfaces of the source/drain regions SD, a bottom surface defined by the top surface ts2 of the second region R2, and sidewalls defined by a lowermost internal spacer 146 and a lower interlayer dielectric layer 150. Semiconductor chips (having integrated circuits formed therein) may be cut from the wafer W and form elements of semiconductor device packages.

According to exemplary embodiments of the present disclosure, since the source/drain regions are spaced apart from their underlying substrate (i.e., the active patterns), a current leakage may be prevented or minimized between the source/drain regions and the substrate. Moreover, since the source/drain regions are embodied as epitaxial patterns grown only from the channel semiconductor patterns serving as seed layers, an increased strain may be provided to the channel semiconductor patterns in comparison with a case that the source/drain regions are embodied as epitaxial patterns grown both from the substrate and the channel semiconductor patterns serving as seed layers As a result, the semiconductor device may have enhanced electrical characteristics.

Although the present invention has been described in connection with the embodiments of the present invention illustrated in the accompanying drawings, it will be understood to those skilled in the art that various changes and modifications may be made without departing from the technical spirit and essential feature of the present invention. It will be apparent to those skilled in the art that various substitution, modifications, and changes may be thereto without departing from the scope and spirit of the disclosure.

What is claimed is:

1. A semiconductor device, comprising:
a substrate;
channel semiconductor patterns vertically stacked and spaced apart from each other on the substrate;
a gate electrode running across the channel semiconductor patterns;
source/drain regions at opposite sides of the gate electrode, the source/drain regions being connected to the channel semiconductor patterns;
an interlayer dielectric layer covering the source/drain regions; and
air gaps between the substrate and bottom surfaces of the source/drain regions so that the bottom surfaces of the source/drain regions do not contact the substrate,
wherein, when viewed in cross section, top surfaces of the air gaps are defined by the bottom surfaces of the source/drain regions, and side surfaces of the air gaps are defined by the interlayer dielectric layer,
wherein the substrate comprises on its upper portion a fin-shaped active pattern including a first region under the gate electrode and second regions on the opposite sides of the gate electrode,
wherein the channel semiconductor patterns are disposed on the first region, and
wherein the bottom surfaces of the source/drain regions are lower than a bottom surface of a lowermost one of the channel semiconductor patterns and higher than top surfaces of the second regions.

2. The semiconductor device of claim 1, further comprising growth prevention regions provided under the bottom surfaces of the source/drain regions and defining bottom surfaces of the air gaps.

3. The semiconductor device of claim 2, wherein the growth prevention regions are impurity regions formed in the substrate under the bottom surfaces of the source/drain regions.

4. The semiconductor device of claim 3, wherein the growth prevention regions are doped with an impurity including one or more of carbon, oxygen, arsenic, and nitrogen.

5. The semiconductor device of claim 2, wherein the growth prevention regions are insulation layers formed on the substrate under the bottom surfaces of the source/drain regions.

6. The semiconductor device of claim 5, further comprising inner spacers disposed on sidewalls of the gate electrode, each of the inner spacers being interposed between the channel semiconductor patterns adjacent to each other or between the substrate and a lowermost one of the channel semiconductor patterns,
wherein the growth prevention regions and the inner spacers comprise the same material.

7. The semiconductor device of claim 6, wherein at least one of the growth prevention regions is connected to the inner spacers between the substrate and the lowermost one of the channel semiconductor patterns.

8. The semiconductor device of claim 1, wherein the channel semiconductor patterns penetrate the gate electrode, each of the channel semiconductor patterns having opposite ends that protrude from opposite sidewalls of the gate electrode.

9. A semiconductor device, comprising:
an active pattern protruding from a substrate;
a channel stack on the active pattern;
a gate electrode covering the channel stack and running across the active pattern; and
source/drain regions on the active pattern at opposite sides of the gate electrode,
wherein the channel stack comprises channel semiconductor patterns vertically stacked and spaced apart from each other,
wherein air gaps are provided between the source/drain regions and the active pattern so that the source/drain regions do not contact the-active pattern,
wherein a bottommost surface of the gate electrode is lower than bottommost surfaces of the source/drain regions,
wherein the active pattern comprises a first region under the gate electrode and second regions spaced apart from each other across the first region,
wherein the second regions are recessed on their upper portions, and
wherein the recessed second regions have top surfaces concavely recessed toward the substrate.

10. The semiconductor device of claim 9, further comprising growth prevention regions between the source/drain regions and the active pattern under the source/drain regions,
wherein the growth prevention regions are either impurity regions formed in the second regions or insulation layers formed on top surfaces of the second regions.

11. The semiconductor device of claim 10, further comprising inner spacers disposed on sidewalls of the gate electrode,
wherein the inner spacers are interposed between the channel semiconductor patterns adjacent to each other and between the first region and a lowermost one of the channel semiconductor patterns, respectively.

12. The semiconductor device of claim 11, wherein
the growth prevention regions are insulation layers formed on the top surfaces of the second regions, and
the inner spacers and the growth prevention regions comprise same material.

13. The semiconductor device of claim 12, wherein at least one of the growth prevention regions is connected to the inner spacers between the first region and the lowermost one of the channel semiconductor patterns.

14. A semiconductor device, comprising:
a substrate having an active pattern extending in a first direction, the active pattern having a first region, a second region, and a third region between the first region and the second region;
first channel semiconductor patterns vertically stacked and spaced apart from each other on the first region of the active pattern;
second channel semiconductor patterns vertically stacked and spaced apart from each other on the second region of the active pattern;
first and second gate structures extending in a second direction perpendicular to the first direction and running across the first and second channel semiconductor patterns, respectively;
a source/drain region on the third region of the active pattern and between the first and second gate structures, the source/drain region connecting the first channel semiconductor patterns on the first region to the second channel semiconductor patterns on the second region; and
an air gap between a bottom surface of the source/drain region and a top surface of the third region so that the bottom surface of the source/drain region does not contact the top surface of the third region,
wherein a top surface of the air gap is defined by the bottom surface of the source/drain region, and a bottom surface of the air gap is defined by the top surface of the third region,
wherein the third region is recessed on its upper portion, and
wherein the top surfaces of the third region is concavely recessed toward the substrate.

15. The semiconductor device of claim 14, wherein the first region has a top surface at same level and coplanar as that of the top surface of the third region in a third direction perpendicular to the top surface of the substrate.

16. The semiconductor device of claim 14, wherein each of the first and second gate structures includes a gate electrode, a gate dielectric pattern, and a gate capping pattern, the gate electrode extending in the second direction and covering a top surface of an uppermost channel semiconductor pattern of a corresponding one of the first and second channel semiconductor patterns, the gate dielectric pattern extending along a sidewall and a bottom surface of the gate electrode, and the gate capping pattern covering the gate electrode and the gate dielectric pattern.

17. The semiconductor device of claim 14, further comprising inner spacers disposed on sidewalls of each of the first and second gate structures,
wherein sidewalls of the air gap are defined by a lowermost inner spacer of the inner spacers.

18. The semiconductor device of claim 14, further comprising a growth prevention region provided under the bottom surface of the source/drain region and defining the bottom surface of the air gap.

* * * * *